(12) United States Patent
Kato

(10) Patent No.: US 11,430,704 B2
(45) Date of Patent: Aug. 30, 2022

(54) SUBSTRATE PROCESSING APPARATUS, SUBSTRATE PROCESSING METHOD, AND STORAGE MEDIUM

(71) Applicant: TOKYO ELECTRON LIMITED, Tokyo (JP)

(72) Inventor: Kanzo Kato, Koshi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 280 days.

(21) Appl. No.: 16/502,310

(22) Filed: Jul. 3, 2019

(65) Prior Publication Data
US 2019/0326186 A1 Oct. 24, 2019

Related U.S. Application Data

(62) Division of application No. 15/195,126, filed on Jun. 28, 2016, now Pat. No. 10,395,998.

(30) Foreign Application Priority Data

Jul. 7, 2015 (JP) ................................. 2015-136218

(51) Int. Cl.
H01L 21/00 (2006.01)
H01L 21/66 (2006.01)
H01L 21/67 (2006.01)
H01L 21/02 (2006.01)
H01L 21/027 (2006.01)
G03F 7/38 (2006.01)

(52) U.S. Cl.
CPC ............... *H01L 22/20* (2013.01); *G03F 7/38* (2013.01); *H01L 21/02057* (2013.01); *H01L 21/0273* (2013.01); *H01L 21/67103* (2013.01); *H01L 21/67259* (2013.01); *H01L 22/12* (2013.01)

(58) Field of Classification Search
CPC ..... G03F 7/38; H01L 22/20; H01L 21/02057; H01L 21/0273; H01L 21/67103; H01L 21/67259; H01L 22/12
See application file for complete search history.

(56) References Cited

U.S. PATENT DOCUMENTS 8,698,052 B2 4/2014 Tadokoro et al.
2007/0272680 A1 11/2007 Tadokoro et al.

FOREIGN PATENT DOCUMENTS

JP 2004335707 A 11/2004
JP 2007317732 A 12/2007
JP 2009123816 A 6/2009

*Primary Examiner* — Mounir S Amer
*Assistant Examiner* — Alexander Belousov
(74) *Attorney, Agent, or Firm* — Nath, Goldberg & Meyer; Jerald L. Meyer; Tanya E. Harkins

(57) ABSTRACT

A substrate processing apparatus, including: a development part configured to develop a substrate on which an exposed resist film formed to form a pattern on a surface of the substrate; a heat plate configured to mount and heat the substrate on which the resist film formed on the heat plate before the development is performed; a distribution acquisition part configured to optically acquire a size distribution of a dimension of the pattern on the surface of the substrate; and a determination part configured to determine whether abnormality has occurred in a mounting state of the substrate on the heat plate, based on the size distribution of the dimension of the pattern.

6 Claims, 21 Drawing Sheets

FIG. 6
Mounting abnormality type 1
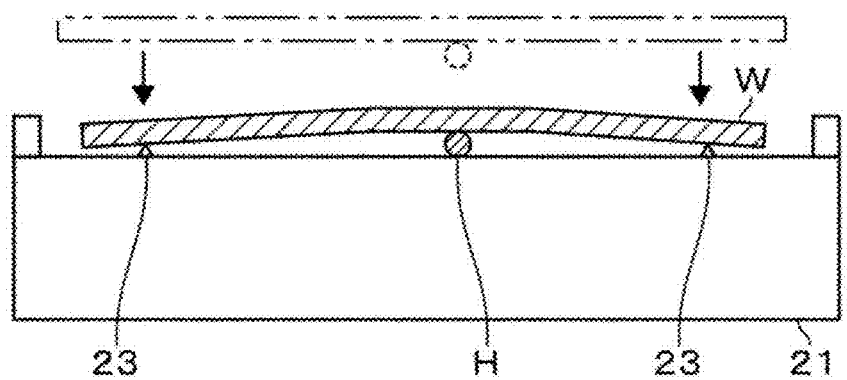
FIG. 7
Mounting abnormality type 1
CD distribution
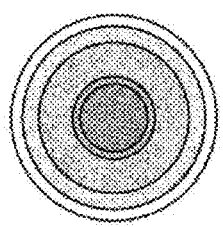
Concentricity of CD distribution
Continuous reproducibility
Exclusive transfer reproducibility
Thin  Thick Mounting abnormality type 2

Mounting abnormality type 2

Mounting abnormality type 3

Mounting abnormality type 3

Mounting abnormality type 4

Mounting abnormality type 4

FIG. 14
Mounting abnormality type 5
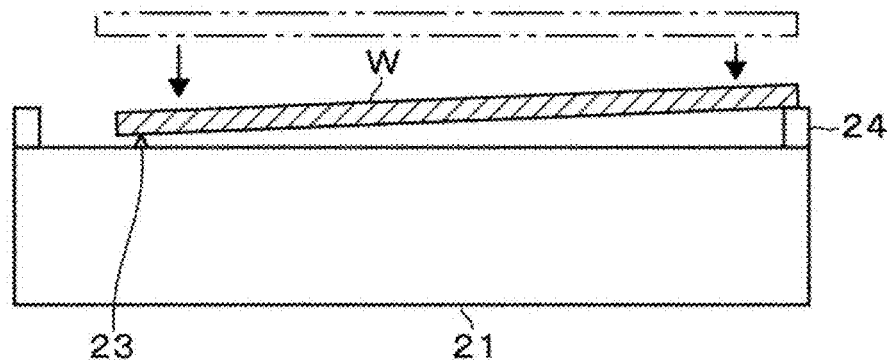
FIG. 15
Mounting abnormality type 5
CD distribution
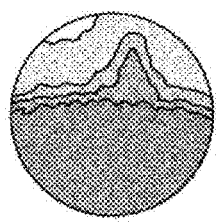
| Concentricity of CD distribution | Continuous reproducibility | Exclusive transfer reproducibility |
|---|---|---|
| × | ○ | × |
Thin  Thick

FIG. 16
Mounting abnormality type 6
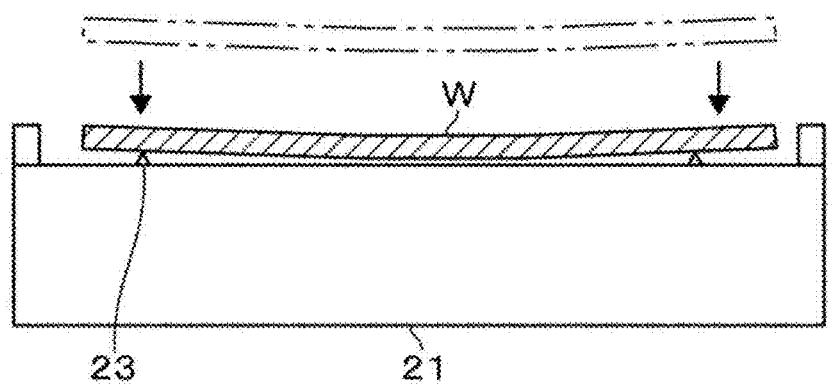
FIG. 17
Mounting abnormality type 6
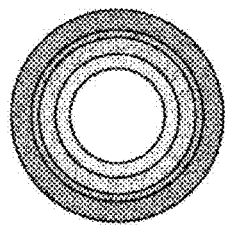
CD distribution
Concentricity of CD distribution 
Continuous reproducibility 
Exclusive transfer reproducibility 
Thin  Thick

FIG. 18
Mounting abnormality type 7
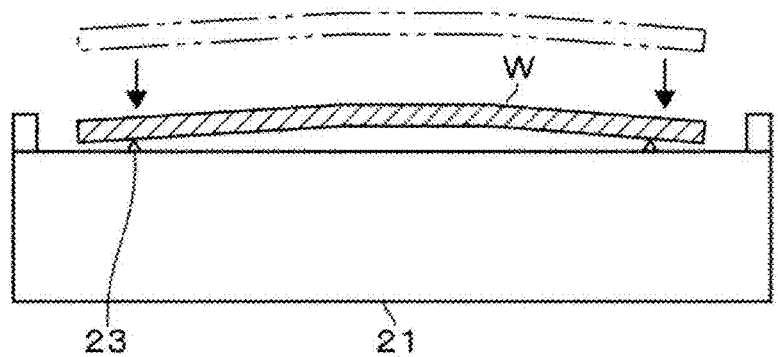
FIG. 19
Mounting abnormality type 7
CD distribution
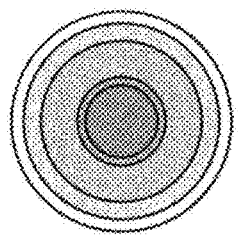
Thin ▢▨▨▨ Thick
Concentricity of CD distribution 
Continuous reproducibility 
Exclusive transfer reproducibility 

SUBSTRATE PROCESSING APPARATUS, SUBSTRATE PROCESSING METHOD, AND STORAGE MEDIUM

CROSS-REFERENCE TO RELATED APPLICATION

This is a Divisional Application of U.S. patent application Ser. No. 15/195,126, filed Jun. 28, 2016, an application claiming benefit of Japanese Patent Application No. 2015-136218, filed on Jul. 7, 2015, in the Japanese Patent Office, the content of each of which is hereby incorporated by reference in its entirety.

TECHNICAL FIELD

The present disclosure relates to a substrate processing apparatus including a heat plate that heats a substrate having a resist film formed thereon, before development, a substrate processing method, and a non-transitory computer-readable storage medium.

BACKGROUND

In a photolithography process of forming a resist pattern on a semiconductor wafer (hereinafter, referred to as a wafer) that is a substrate, heat processing is performed on the wafer using a heating device (heating module). The heat processing may be, for example, a process called as post exposure baking (PEB), by which after a resist film is exposed along a predetermined pattern, a wafer before development processing is heated. The heating device is configured to include, for example, a heat plate that heats a wafer mounted on the heat plate. There is known a heating device including the heat plate.

However, the heat processing may be performed in a state in which the wafer is transferred to the heat plate in a state in which a foreign substance exists on the heat plate or is attached to a back side of the wafer, so that the wafer is placed on the foreign substance interposed between a surface of the heat plate and the back side of the wafer. In this case, distances between the surface of the heat plate and the back side of the wafer at in-plane portions of the wafer are different from each other, and therefore, temperatures of the in-plane portions of the wafer may be different from each other. As a result, critical dimensions (CDs) as dimensions of the resist pattern at the in-plane portions of the wafer after development may be formed differently from each other.

In the type of heating device that has already been described, it is detected whether abnormality has occurred in the mounting state of a wafer, based on a profile of changes in the temperature of the heat plate when the wafer was mounted on the heat plate. However, if the height of a foreign substance is relatively small, a difference between a temperature decrease in a region in which the foreign substance exists on the heat plate and a temperature decrease in another region of the heat plate is small, and hence it cannot be detected whether the wafer is placed on the foreign substance. Therefore, it is impossible to accurately determine whether an abnormality has occurred in the CD.

SUMMARY

Some embodiments of the present disclosure provide a technique capable of highly accurately detecting whether abnormality occurs in the mounting state of a substrate on a heat plate.

According to one embodiment of the present disclosure, there is provided a substrate processing apparatus. The apparatus includes: a development part configured to develop a substrate, on which an exposed resist film formed, to form a pattern on a surface of the substrate; a heat plate configured to mount and heat the substrate, on which the resist film formed, on the heat plate before the development is performed; a distribution acquisition part configured to optically acquire a size distribution of a dimension of the pattern on the surface of the substrate; and a determination part configured to determine whether an abnormality has occurred in a mounting state of the substrate on the heat plate, based on the size distribution of the dimension of the pattern.

According to another embodiment of the present disclosure, there is provided a substrate processing method. The method includes: developing, by a development part, a substrate on which an exposed resist film formed to form a pattern on a surface of the substrate; mounting and heating the substrate, on which the resist film formed, on a heat plate before the developing; optically acquiring a size distribution of a dimension of the pattern on the surface of the substrate; and determining whether abnormality has occurred in a mounting state of the substrate on the heat plate, based on the acquired size distribution of the dimension of the pattern.

According to yet another embodiment of the present disclosure, there is provided a non-transitory computer-readable storage medium storing a computer program used in a substrate processing apparatus for developing a substrate on which an exposed resist film formed to form a pattern, wherein the program includes a group of steps for performing the substrate processing method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 6 is an explanation view illustrating mounting abnormality of the wafer on a heat plate.

FIG. 7 is a schematic view of a CD distribution of the wafer, acquired in the mounting abnormality.

FIG. 14 is an explanation view illustrating mounting abnormality of the wafer on a heat plate.

FIG. 15 is a schematic view of a CD distribution of the wafer, acquired in the mounting abnormality.

FIG. 16 is an explanation view illustrating mounting abnormality of the wafer on a heat plate.

FIG. 17 is a schematic view of a CD distribution of the wafer, acquired in the mounting abnormality.

FIG. 18 is an explanation view illustrating mounting abnormality of the wafer on a heat plate.

FIG. 19 is a schematic view of a CD distribution of the wafer, acquired in the mounting abnormality.

DETAILED DESCRIPTION

Figure 1:
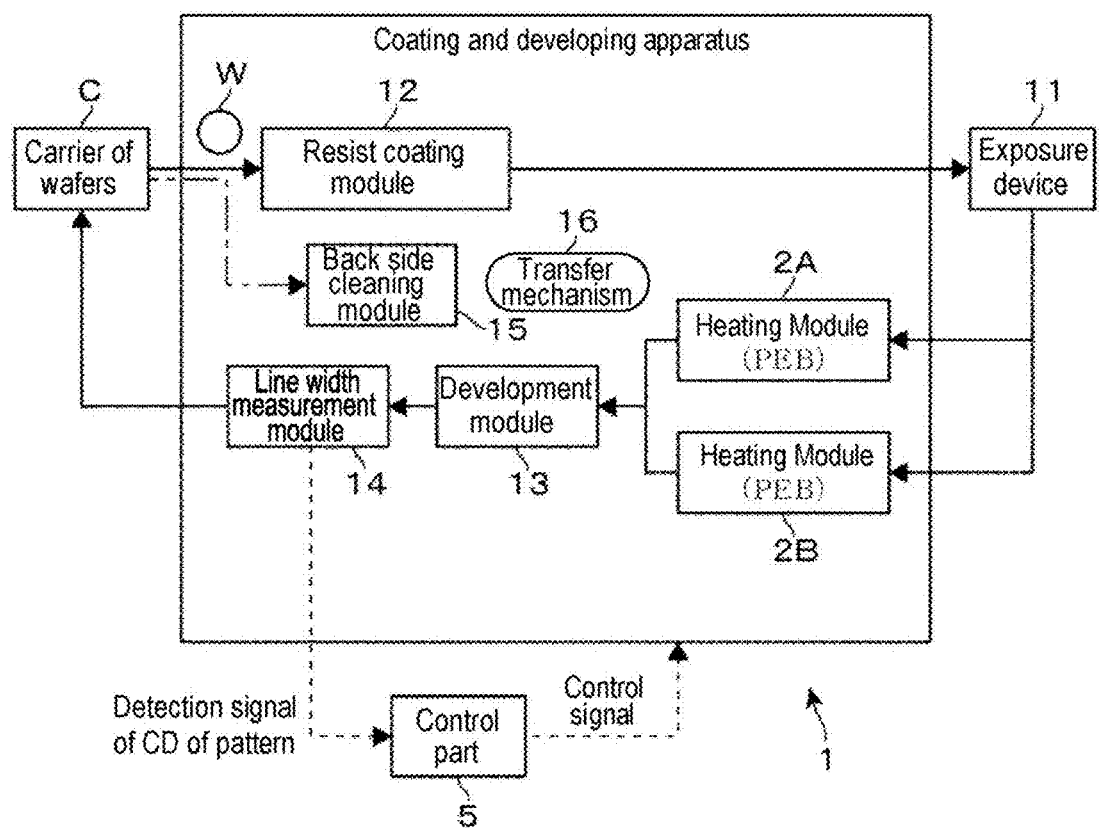
FIG. 1 is a schematic configuration view of a coating and developing apparatus according to an embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A coating and developing apparatus 1 according to an embodiment of the present disclosure will be described with reference to a schematic view of FIG. 1. An exposure device 11 is connected to the coating and developing apparatus 1, and the coating and developing apparatus 1 includes a resist coating module 12, a heating module 2A, a heating module 2B, a development module 13, a line width measurement module 14, and a back side cleaning module 15.

A carrier C that stores, for example, a plurality of wafers W in the same lot are transferred to the coating and developing apparatus 1 from the outside. A wafer W in the carrier C is generally transferred to the resist coating module 12, the exposure device 11, the heating module 2A or 2B, the development module 13, and the line width measurement module 14 in this order, as shown by a solid-line arrow in the figure, and then returned to the carrier C by a transfer mechanism 16 installed in the coating and developing apparatus 1. The wafer W is transferred to one of the heating modules 2A and 2B, which is empty, i.e., which is in a state where it has no wafer W being processed. As will be described later, the transfer mechanism 16 is configured with a plurality of transfer mechanisms. If modules of a transfer source and a transfer destination are different from each other in the above-described transfer, the wafer W is delivered by different transfer mechanisms.

The resist coating module 12 coats a positive-type or negative type resist on the surface of the wafer W, thereby forming a resist film. Further, the resist coating module 12 supplies a solvent for removing the resist film to wafers W determined to be abnormal as will be described later. Nozzles for respectively supplying the resist and the solvent are installed in the resist coating module 12, and the nozzle for supplying the solvent constitutes a resist film removing mechanism. The exposure device 11 exposes the resist film along a predetermined pattern.

In the heating modules 2A and 2B, the PEB, which has already been described, is performed on the wafer W. The PEB will be described in detail. This processing is a heating processing for eliminating influence of a standing wave in the resist film, which is generated upon the exposure. When the resist film is formed with a chemically amplified resist, the amount of an acid in the resist film increases, and therefore, solubility with respect to a developer at an exposure place is changed. The heating modules 2A and 2B have such actions, so that if heat processing in the heating modules 2A and 2B is abnormal, the CD of a pattern of the wafer W is changed from a designed value.

In the development module 13 that is a development part, a developer is supplied to the wafer W, so that a region in the resist film that is exposed by the exposure device 11 or a region in the resist film that is not exposed by the exposure device 11 is dissolved, thereby forming a resist pattern as unevenness on the resist film. The line width measurement module 14 is a module for acquiring a distribution of CDs by performing measurement of line widths of the resist pattern at in-plane portions of the wafer W, i.e., CDs as dimensions.

As the wafer W is transferred in the above-described order of the modules, the resist pattern is formed on the wafer W, and the in-plane distribution of CDs of the wafer W is acquired. The back side cleaning module 15 includes a brush that rubs a back side of the wafer W and a cleaning liquid supply part that supplies a cleaning liquid to the back side of the wafer W, and a foreign substance H attached to the back side of the wafer W can be removed by the actions of the brush and the cleaning liquid. Wafers W determined to be abnormal may be transferred, as indicated by a dashed-line arrow in the figure, from the carrier C to the back side cleaning module 15 by the transfer mechanism 16, and then transferred to the resist coating module 12. Detailed transfer of each wafer W will be described later.

Figure 2:
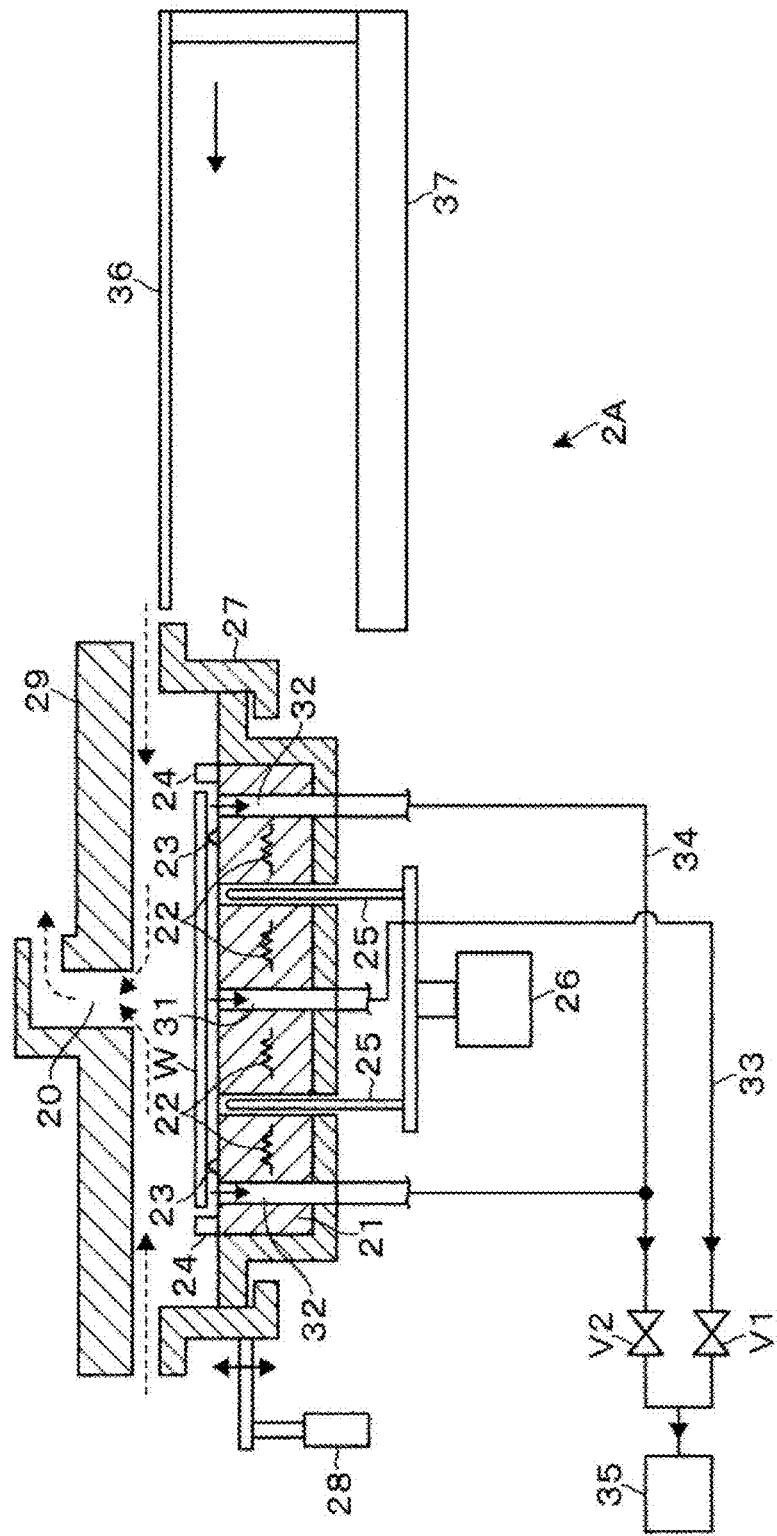
FIG. 2 is a longitudinal cross sectional side view of a heating module included in the coating and developing apparatus.

The heating modules 2A and 2B will be described in detail. The heating modules 2A and 2B are configured identically to each other. Here, the heating module 2A will be representatively described with reference to a longitudinal cross sectional side view of FIG. 2 and a transverse cross sectional plan view of FIG. 3. The heating module 2A includes a circular horizontal heat plate 21 that forms a mounting part of the wafer W. In FIG. 2, reference numeral 22 designates a heater for heating the heat plate 21.

Figure 3:
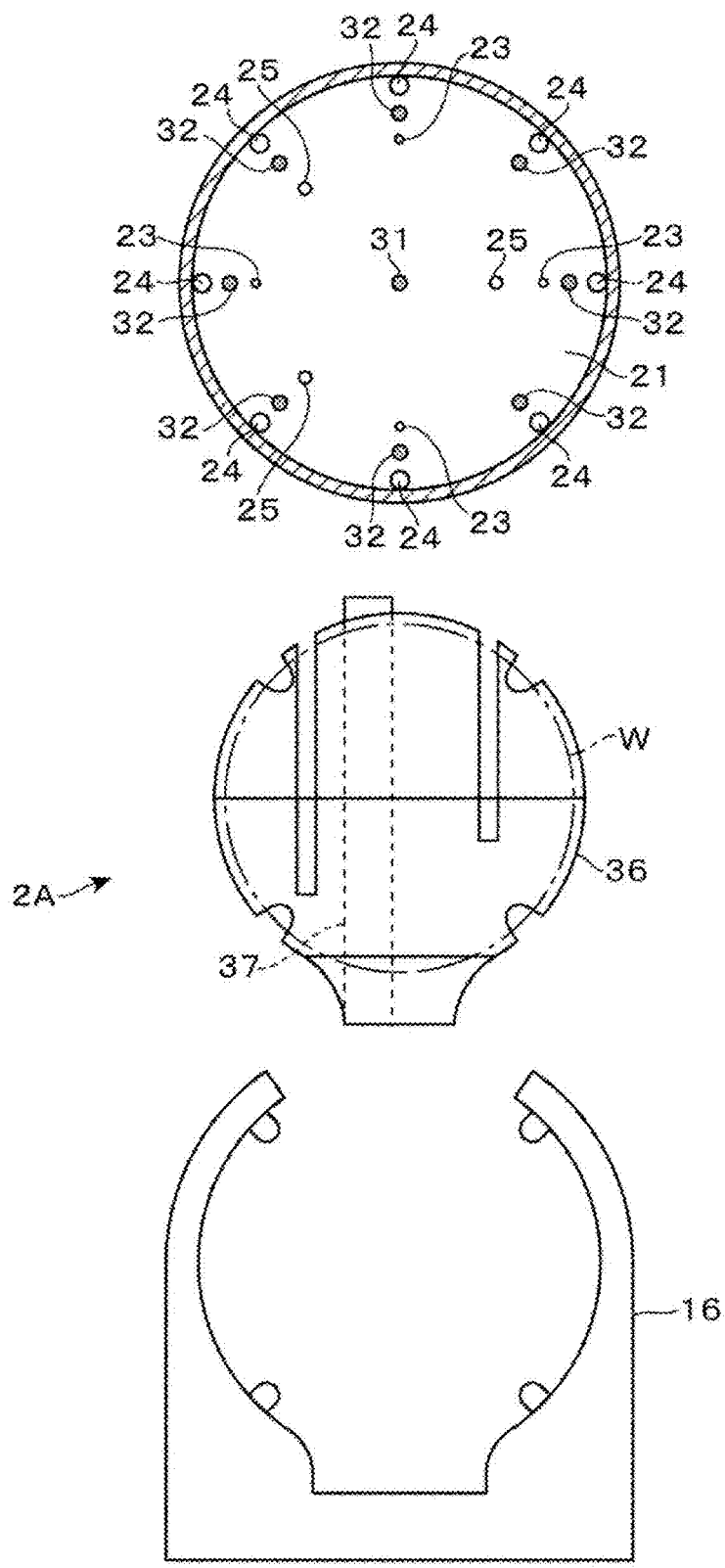
FIG. 3 is a transverse cross sectional plan view of the heating module.

A plurality of support pins 23 are distributedly provided on a surface of the heat plate 21. In FIGS. 2 and 3, reference numeral 24 designates a regulation pin that is provided in plurality in the peripheral direction of the heat plate 21 so as to regulate a position of the wafer W in the lateral direction on the heat plate 21. When the wafer W is normally mounted on the heat plate 21, the wafer W is horizontally supported on the support pins 23 in a region surrounded by the regulation pins 24, to be heated in a state in which the wafer W is slightly raised up from the heat plate 21. FIG. 2 shows the wafer W that is normally mounted on the heat plate 21 to be heated as described above. As will be described later, in the coating and developing apparatus 1, it is determined whether an abnormality has occurred in the mounting of the wafer W on the heat plate 21. In FIG. 2, reference numeral 25 designates a lifting pin lifted up and down by a lifting mechanism 26. The lifting pin 25 protrudes from the surface of the heat plate 21, so that the wafer W is delivered between the heat plate 21 and a cooling plate 36 which will be described later.

An exhaust port (suction port) 31 is opened at a central portion of the heat plate 21, and a plurality of exhaust ports (suction ports) 32 are opened along the peripheral direction of the heat plate 21 at a peripheral portion of the heat plate 21. These exhaust ports 31 and 32 respectively suck the central portion and the peripheral portion of the wafer W when the wafer W is mounted on the heat plate 21, thereby preventing a position offset. One end of each of the exhaust pipes 33 and 34 are respectively connected to the exhaust ports 31 and 32, and the other end of each of the exhaust pipes 33 and 34 is connected to, for example, an exhaust pump 35 respectively through valves V1 and V2. Thus, opening degrees of the valves V1 and V2 are individually adjusted, so that exhaust flow rates from the exhaust ports 31 and 32 can be individually controlled. In FIG. 3, for a better understanding of the figure, the exhaust ports 31 and 32 are indicated by a plurality of dots.

In FIG. 2, reference numeral 27 designates a shutter vertically moved by a lifting mechanism 28, and the shutter 27 is configured in the shape of a standing cylinder surrounding the heat plate 21. In FIG. 2, reference numeral 29 designates a circular ceiling plate, and the ceiling plate 29 is provided above the heat plate 21. An exhaust port 20 is opened at a central portion of a bottom surface of the ceiling plate 29. When the wafer W is heat-processed while being mounted on the heat plate 21, as shown in FIG. 2, exhaust flows through the exhaust port 20 so that air is drawn from a slight gap formed between a top end of the shutter 27 and a peripheral portion of the ceiling plate 29. In FIG. 2, a dotted-line arrow indicates the current of air flowing on the heat plate 21 from the outside of the heat plate 21 caused by the exhaust, and the wafer W is heated while being exposed to the current. When a cooling plate 36 which will be described later delivers the wafer W with respect to the heat plate 21, the shutter 27 descends from a position shown in FIG. 2 so as not to interfere with movement of the cooling plate 36.

The cooling plate 36 includes a flow path of a coolant, to cool the mounted wafer W and to be moved forward and backward between a position over the heat plate 21 and a standby position shown in FIGS. 2 and 3 by a drive mechanism 37. The transfer mechanism 16 moves up and down with the cooling plate 36 located at the standby position, so that the delivery of the wafer W is performed.

Figure 4:
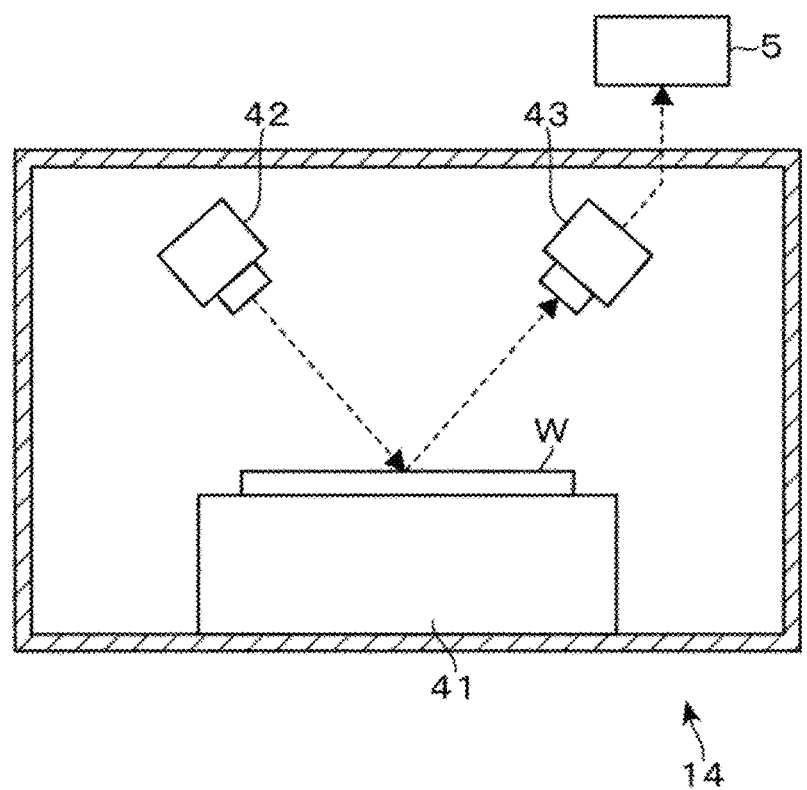
FIG. 4 is a schematic longitudinal cross sectional side view of a line width measurement module included in the coating and developing apparatus.

Subsequently, the line width measurement module 14 as a distribution acquisition part will be described with reference to a schematic longitudinal cross sectional side view of FIG. 4. The line width measurement module 14 is a module for measuring a CD of a resist pattern using scatterometry. In FIG. 4, reference numeral 41 designates a mounting table, and the mounting table 41 horizontally mounts the wafer W.

In FIG. 4, reference numeral 42 designates a light irradiation part, and reference numeral 43 designates a light receiving part. The light irradiation part 42 diagonally irradiates light onto the wafer W from above. The light receiving part 43 receives light reflected off the wafer W and transmits, to a control part 5, a detection signal corresponding to the received light. The control part 5 measures a CD of the resist pattern at a place on the wafer W, onto which the light is irradiated by the light irradiation part 42, based on the detection signal.

Figure 5:
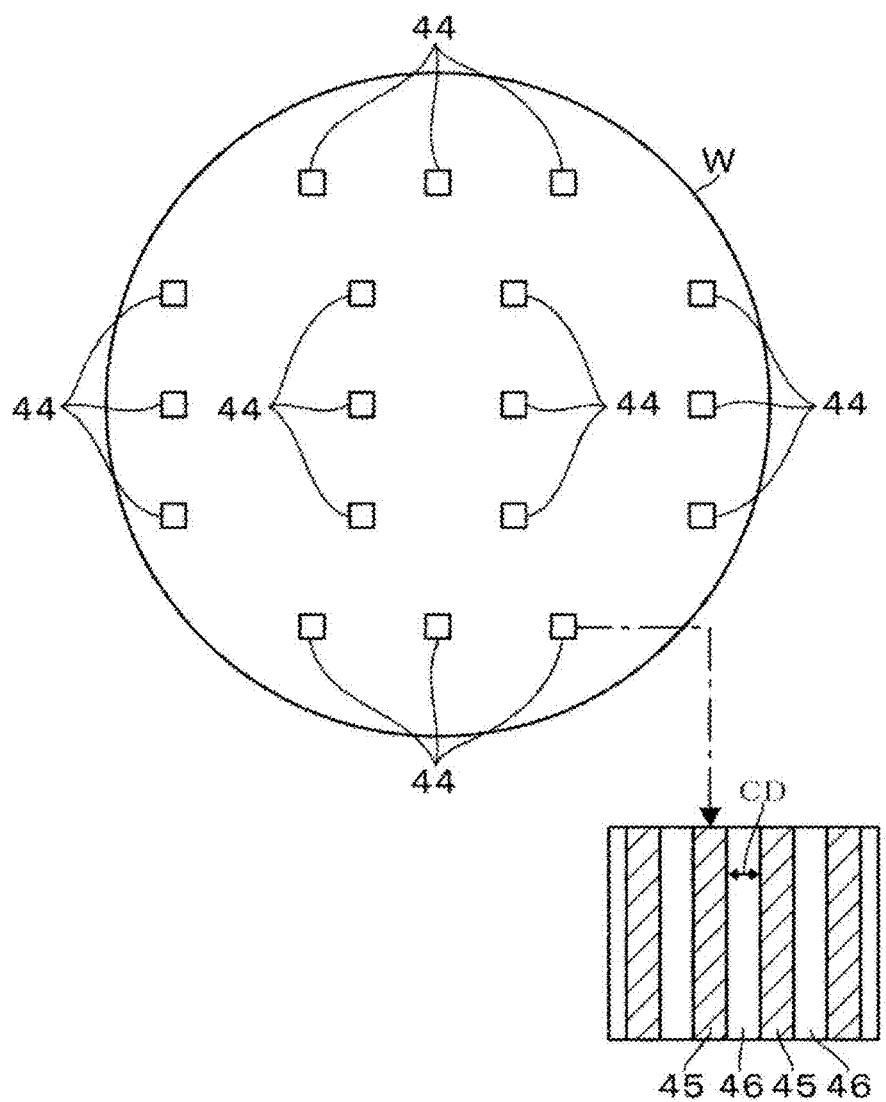
FIG. 5 is a plan view illustrating an example of measurement places of CDs of a wafer.

The mounting table 41 may be horizontally moved from front to back and from side to side by a drive mechanism (not shown). Accordingly, as shown in FIG. 5, light is irradiated from the light irradiation part 42 onto a plurality of measurement places 44 set to be distributed in the surface of the wafer W, thereby measuring CDs at the measurement places 44. FIG. 5 shows an enlarged measurement place 44 at the end of a dashed-line arrow. In FIG. 5, reference numerals 45 and 46 designate convex and concave portions of a pattern, respectively. Further, FIG. 5 shows that the measurement places 44 are arranged to be widely distributed in the surface of the wafer W. However, it is unnecessary to set the measurement places 44 as shown in FIG. 5, and the measurement places 44 may be set to acquire an in-plane distribution of CDs of the wafer W, so that it can be determined whether abnormality has occurred in the mounting of the wafer W on the heat plate 21, which will be described later.

Subsequently, the control part 5 constituting a determination part installed in the coating and developing apparatus 1 will be described. The control part 5 includes, for example, a computer and has a program storage part (not shown). The program storage part stores a program including instructions (a group of steps) for performing the above-described various operations and other various operations which will be described later, such as operations of the modules, transfer of the wafer W by the transfer mechanism 16, measurement of sizes of CDs based on a detection signal from the line width measurement module 14, acquisition of an in-plane distribution of CDs of the wafer W based on the measured CDs, and various determinations which will be described later. In addition, a control signal is output from the control part 5 to each part of the coating and developing apparatus 1 by the program, so that the operation of each part of the coating and developing apparatus 1 is controlled. The program is stored in the program storage part in a state in which it is included in, for example, a storage medium such as a hard disk, a compact disk, a magneto optical disk, or a memory card.

Meanwhile, an in-plane distribution of CDs of the wafer W, which is acquired by the control part 5, will be described in detail. As described above, the control part 5 may acquire CDs at the measurement places 44 by the line width measurement module 14. The control part 5 estimates CDs at places except the measurement places 44 from the acquired CDs according to a predetermined algorithm, thereby acquiring a distribution of CDs at overall in-plane places of the wafer W. When the wafer W is heated while being normally mounted on the heat plate 21 of the heating module 2A or 2B which has already been described, the CDs of the overall places correspond or approximately correspond to each other. The control part 5 determines whether abnormality has occurred in the mounting of the wafer W on the heat plate 21, based on the distribution of CDs.

In addition, an alarm output device is installed in the control part 5. When it is determined that an abnormality has occurred in the mounting of the wafer W on the heat plate 21, such a determination and information regarding which one of the heating modules 2A and 2B has heat-processed the wafer W are output as an alarm to be notified to a user of the apparatus. When an abnormality has occurred in the mounting of the wafer W as will be described later, the control part 5 determines (estimates) a type of the abnormality (mounting abnormality type). A determination result of the mounting abnormality type is also output as an alarm, to be notified to the user. Specifically, the alarm output device is configured as, for example, a monitor screen, a speaker, etc., and the alarm is a predetermined screen display or sound.

Subsequently, each mounting abnormality type and an in-plane CD distribution acquired from the wafer W when abnormality has occurred in the mounting of the wafer W will be described.

Mounting Abnormality Type 1

The wafer W is transferred to the heat plate 21 in a state in which the foreign substance H is attached to a central portion of a back side of the wafer W, and mounted such that the central portion of the wafer W is placed on the foreign substance H as shown in FIG. 6. Accordingly, the central portion of the wafer W mounted on the heat plate 21 is more distant from the heat plate 21 than a peripheral portion of the wafer W, and hence the temperature of the central portion of the wafer W is lower than that of the peripheral portion of the wafer W.

FIG. 7 shows a CD distribution acquired from the wafer W developed after being heated in this manner. More specifically, FIG. 7 shows, in monochrome, computer graphics of the wafer W, created by performing coloring according to sizes of CDs acquired at in-plane portions of the wafer W, which is simplified because of space limitations. The wafer W is heated in a state in which distances at the in-plane portions of the wafer W from the heat plate 21 are different from each other as described above, so that a region having the same or approximately same CD is formed in a ring shape about the center of the wafer W. In addition, a region with one size of CD and a region with another size of CD are formed in a concentric shape. Hereinafter, such a CD distribution means that concentricity exists in the CD distribution. Furthermore, the CD is relatively large (thick) at the central portion of the wafer W, and becomes small (thin) toward the peripheral portion of the wafer W.

Meanwhile, it is assumed that an abnormality has occurred in the mounting state of a wafer A1 transferred to one of the heating modules 2A and 2B, and a wafer A2 subsequent to the wafer A1 is transferred to the one heating module in which the abnormality has occurred in the mounting state of the wafer A1. At this time, when an abnormality in the mounting state of the wafer A2 occurs in the same way as the wafer A1 such that CD distributions of the wafers A1 and A2 become identical to each other, it is assumed that continuous reproducibility exists. Since the attachment of the foreign substance H to the back side of the wafer W accidentally occurs, the continuous reproducibility does not exist with respect to the mounting abnormality type 1.

In addition, it is assumed that the wafer A1 is transferred to the other heating module except the one heating module in which the abnormality has occurred in the mounting state of the wafer A1. That is, it is assumed that the wafer A1 is transferred to the other heating module except the one heating module in which the abnormality has occurred. At this time, an abnormality identical to that in the mounting state, which has occurred in the one heating module, occurs in the wafer A1 in the other heating module such that a CD distribution of the wafer A1 in the other heating module becomes identical to that of the wafer A1 in the one heating module, it is assumed that exclusive transfer reproducibility exists. In the mounting abnormality type 1, the foreign substance is attached to the wafer A1, and hence the mounting states of the wafer A1 in the one heating module and the other heating module are identically abnormal. Therefore, the exclusive transfer reproducibility exists in the mounting abnormality type 1. In FIG. 7 and the following figures, whether there is the eccentricity, whether there is the continuous reproducibility, and whether there is the exclusive transfer reproducibility are designated as ○ and x, respectively.

Mounting Abnormality Type 2

Figure 8:
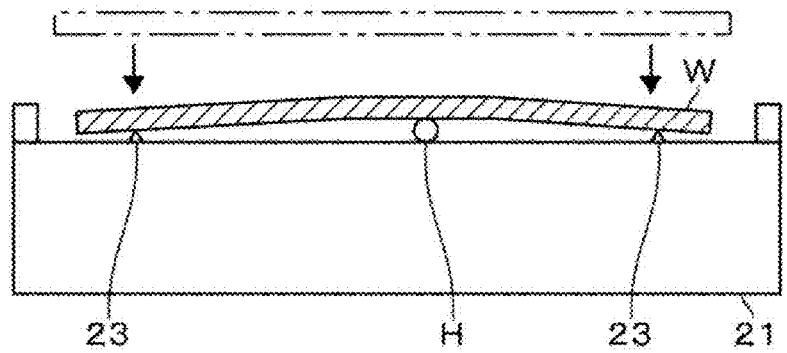
FIG. 8 is an explanation view illustrating mounting abnormality of the wafer on a heat plate.
Figure 9:
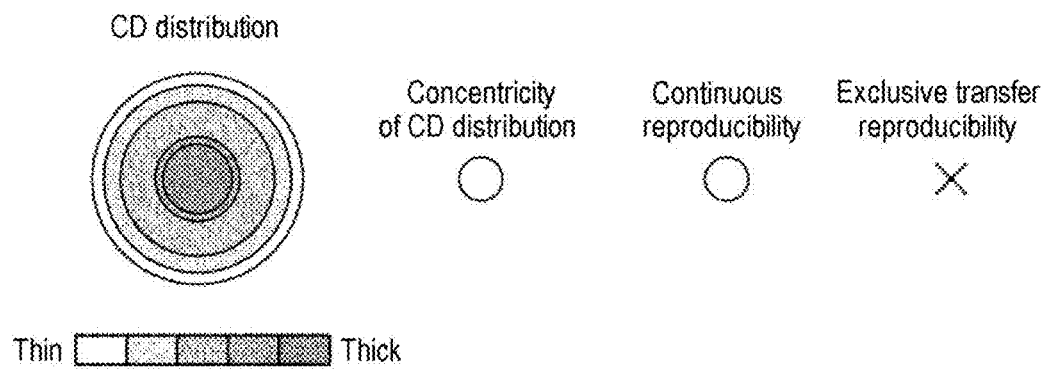
FIG. 9 is a schematic view of a CD distribution of the wafer, acquired in the mounting abnormality.

If the wafer W is transferred to the heat plate 21 in a state in which the foreign substance H is attached to a central portion of the heat plate 21, a central portion of the wafer W is placed on the foreign substance H as shown in FIG. 8. Accordingly, like the mounting abnormality type 1, the central portion of the wafer W mounted on the heat plate 21 is more distant from the heat plate 21 than a peripheral portion of the wafer W, and hence the temperature of the central portion of the wafer W is lower than that of the peripheral portion of the wafer W. Like FIG. 7, FIG. 9 shows a CD distribution acquired from the wafer W developed after being heated in the manner as described above. The CD distribution acquired by heating the wafer W as described above becomes identical to the CD distribution acquired when the mounting abnormality type 1 has occurred. That is, the concentricity exists in the CD distribution. Further, in the CD distribution, the CD is relatively large at the central portion of the wafer W, and becomes smaller toward the peripheral portion of the wafer W.

In the mounting abnormality type 2, the foreign substance H remains on the heat plate 21 even after abnormality has occurred in the mounting state of the wafer A1, and hence the wafer A2 subsequently transferred to the heat plate 21 is also placed on the foreign substance H, which results in mounting abnormality. Therefore, the continuous reproducibility exists in the mounting abnormality type 2. Unlike the mounting abnormality type 1, the foreign substance H does not move together with the wafer A1. Hence, although the abnormality has occurred in the mounting state of the wafer A1 in one of the heating modules 2A and 2B, the abnormality does not occurs in the other heating module. Thus, the exclusive transfer reproducibility does not exist in the mounting abnormality type 2.

Mounting Abnormality Type 3

Figure 10:
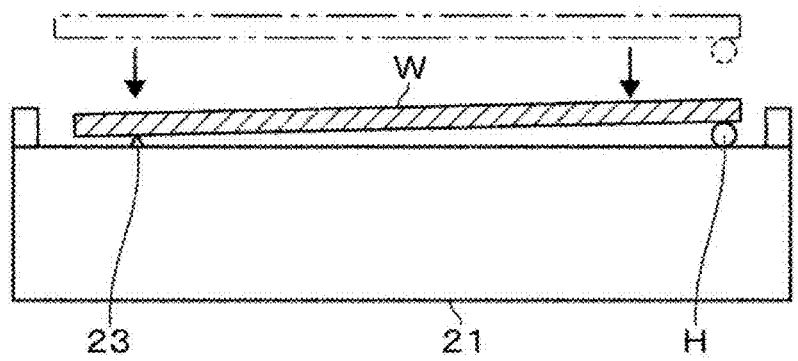
FIG. 10 is an explanation view illustrating mounting abnormality of the wafer on a heat plate.
Figure 11:
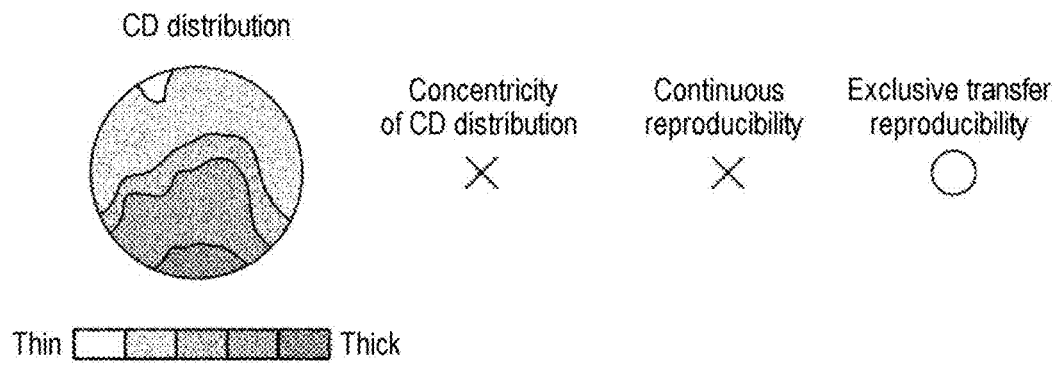
FIG. 11 is a schematic view of a CD distribution of the wafer, acquired in the mounting abnormality.

The mounting abnormality type 3 is approximately identical to the mounting abnormality type 1, but the foreign substance H is attached to a peripheral portion of a back side of the wafer W instead of a central portion of the back side of the wafer W. The foreign substance H is attached as described above, and therefore, the wafer W is mounted on the heat plate 21 such that one end portion of the wafer W is placed on the foreign substance H as shown in FIG. 10. Accordingly, the one end portion of the wafer W is more distant from the heat plate 21 than the other end portion of the wafer W, and hence the temperature of the one end portion of the wafer W is lower than that of the other end portion of the wafer W. FIG. 11 shows a CD distribution acquired from the wafer W developed after being heated in this manner. As the wafer W is heated as described above, a CD at the one end portion of the wafer W is larger than that at the other end portion of the wafer W, and the concentricity does not exist in the CD distribution. For the same reason as that described in the mounting abnormality type 1, the continuous reproducibility does not exist in the mounting abnormality type 3, and the exclusive transfer reproducibility exists in the mounting abnormality type 3.

Mounting Abnormality Type 4

Figure 12:
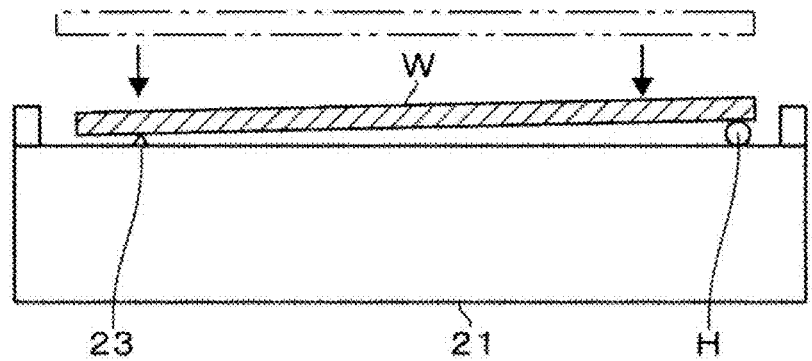
FIG. 12 is an explanation view illustrating mounting abnormality of the wafer on a heat plate.
Figure 13:
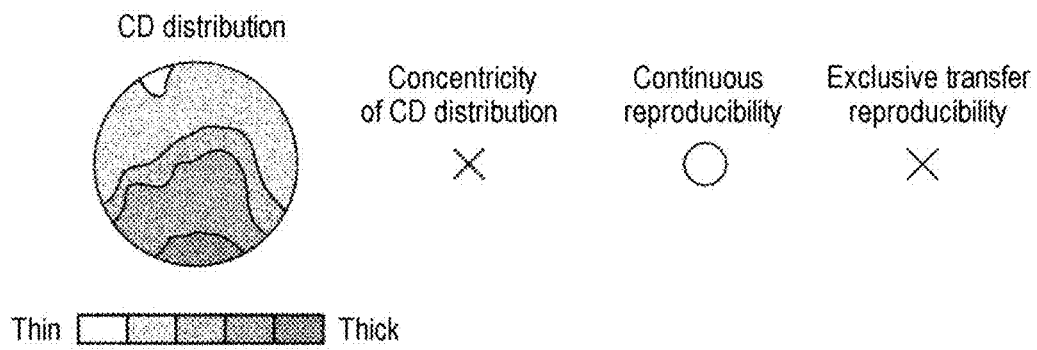
FIG. 13 is a schematic view of a CD distribution of the wafer, acquired in the mounting abnormality.

The mounting abnormality type 4 is approximately identical to the mounting abnormality type 2, but the foreign substance H is attached to a peripheral portion of the heat plate 21 instead of a central portion of the heat plate 21. As the foreign substance H is attached as described above, the one end portion of the wafer W mounted on the heat plate 21 is placed on the foreign substance H as shown in FIG. 12. Thus, like the case where the abnormality of the mounting abnormality type 3 has occurred, a distance from one end portion of the wafer W to the heat plate 21 is greater than a distance from the other end portion of the wafer W to the heat plate 21. Accordingly, the temperature of the one end portion of the wafer W is lower than that of the other end portion of the wafer W. FIG. 13 shows a CD distribution acquired from the wafer W developed after being heated in the manner as described above. As the wafer W is heated as described above, a CD at the one end portion of the wafer W is larger than that at the other end portion of the wafer W, and the concentricity does not exist in the CD distribution. Further, for the same reason as that described in the mounting abnormality type 2, the continuous reproducibility exists in the mounting abnormality type 4, and the exclusive transfer reproducibility does not exist in the mounting abnormality type 4.

Mounting Abnormality Type 5

The mounting abnormality type 5 is an abnormality occurring in a case where the wafer W is mounted on the heat plate 21 such that one end portion of the wafer W is placed on a regulation pin 24 when the wafer W is delivered with respect to the heat plate 21. As shown in FIG. 14, as the one end portion of the wafer W is placed on the regulation pin 24, a distance from the one end portion of the wafer W to the heat plate 21 is greater than a distance from the other end portion of the wafer W to the heat plate 21, and hence the temperature of the one end portion of the wafer W is lower than that of the other end portion of the wafer W. FIG. 15 shows a CD distribution acquired from the wafer W developed after being heated in this manner. As the wafer W is heated as described above, a CD at the one end portion of the wafer W is larger than that at the other end portion of the wafer W, and the concentricity does not exist in the CD distribution.

The reason why the mounting abnormality type 5 occurs will be described. A position at which the transfer mechanism 16 moves up and down to deliver the wafer W with respect to the cooling plates 36 of the heating modules 2A and 2B is individually set for each heating module 2A or 2B. If abnormality has occurred in the setting of the position at which the transfer mechanism 16 moves up and down, the wafer W is delivered to the position at which abnormality has occurred in the cooling plate 36. Hence, the wafer W is located at the position where the abnormality has occurred even when the cooling plate 36 moves on the heat plate 21. Therefore, when the wafer W is delivered between the cooling plate 36 and the heat plate 21 by the lifting pin 25, the one end portion of the wafer W is placed on the regulation pin 24 as described above. For the cooling plate 36 of one of the heating modules 2A and 2B, of which the setting is abnormal, the wafer W is repeatedly delivered to the position at which the abnormality has occurred, and therefore, the continuous reproducibility exists in the mounting abnormality type 5. In addition, the position at which the transfer mechanism 16 moves up and down is set for each module as described above. Hence, for the cooling plate 36 of the other heating module, the wafer W can be delivered to a normal position. Therefore, the exclusive transfer reproducibility does not exist in the mounting abnormality type 5.

Mounting Abnormality Type 6

The mounting abnormality type 6 occurs as the wafer W is transferred to the heat plate 21 in a state in which it warps such that its central portion is low and its peripheral portion is high, i.e., such that its cross section has a concave shape. In this case, as shown in FIG. 16, a distance from the peripheral portion of the wafer W mounted on the heat plate 21 to the heat plate 21 than a distance from the central portion of the wafer W to the heat plate 21, and hence the temperature of the peripheral portion of the wafer W is lower than that of the central portion of the wafer W. A CD distribution acquired from the wafer W developed after being heated in this manner has the concentricity as shown in FIG. 17. However, unlike the CD distributions acquired when the abnormality has occurred as the mounting abnormality type 1 or 2, the CD becomes large toward the peripheral portion of the wafer W from the central portion of the wafer W.

The wafers W in the same lot are processed under the same processing condition in the resist coating module 12 or various modules (which will be described later) not described in FIG. 1 until the wafer W is transferred to the heating module 2A or 2B. Hence, if the wafer W warps as described above, other wafers W in the same lot also warp. Therefore, the mounting abnormality type 6 has continuous reproducibility. Further, since the mounting abnormality type 6 occurs due to the shape of the wafer W, the exclusive transfer reproducibility exists in the mounting abnormality type 6.

Mounting Abnormality Type 7

The mounting abnormality type 7 occurs as the wafer W is transferred to the heat plate 21 in a state in which it warps such that its peripheral portion is low and its central portion is high. In this case, as shown in FIG. 18, the central portion of the wafer W mounted on the heat plate 21 is more distant from the heat plate 21 than the peripheral portion of the wafer W, and hence the temperature of the central portion of the wafer W is lower than that of the peripheral portion of the wafer W. A CD distribution acquired from the wafer W developed after being heated in this manner has the concentricity as shown in FIG. 19. Like the CD distributions acquired from the wafer W when the mounting abnormality types 1 and 2 occurs, the CD becomes large toward the central portion of the wafer W from the peripheral portion of the wafer W. Further, for the same reason as that described in the mounting abnormality type 6, the continuous reproducibility and the exclusive transfer reproducibility exist in the mounting abnormality type 7.

As described above, whether there is the concentricity, whether there is the continuous reproducibility, and whether there is the exclusive transfer reproducibility in the CD distribution depend on a mounting abnormality type. By using such a property, the control part 5 determines not only whether abnormality has occurred in the mounting state of the wafer W on the heat plate 21 and but also by which one of the mounting abnormality types 1 to 7 causes the abnormality.

Figure 20:
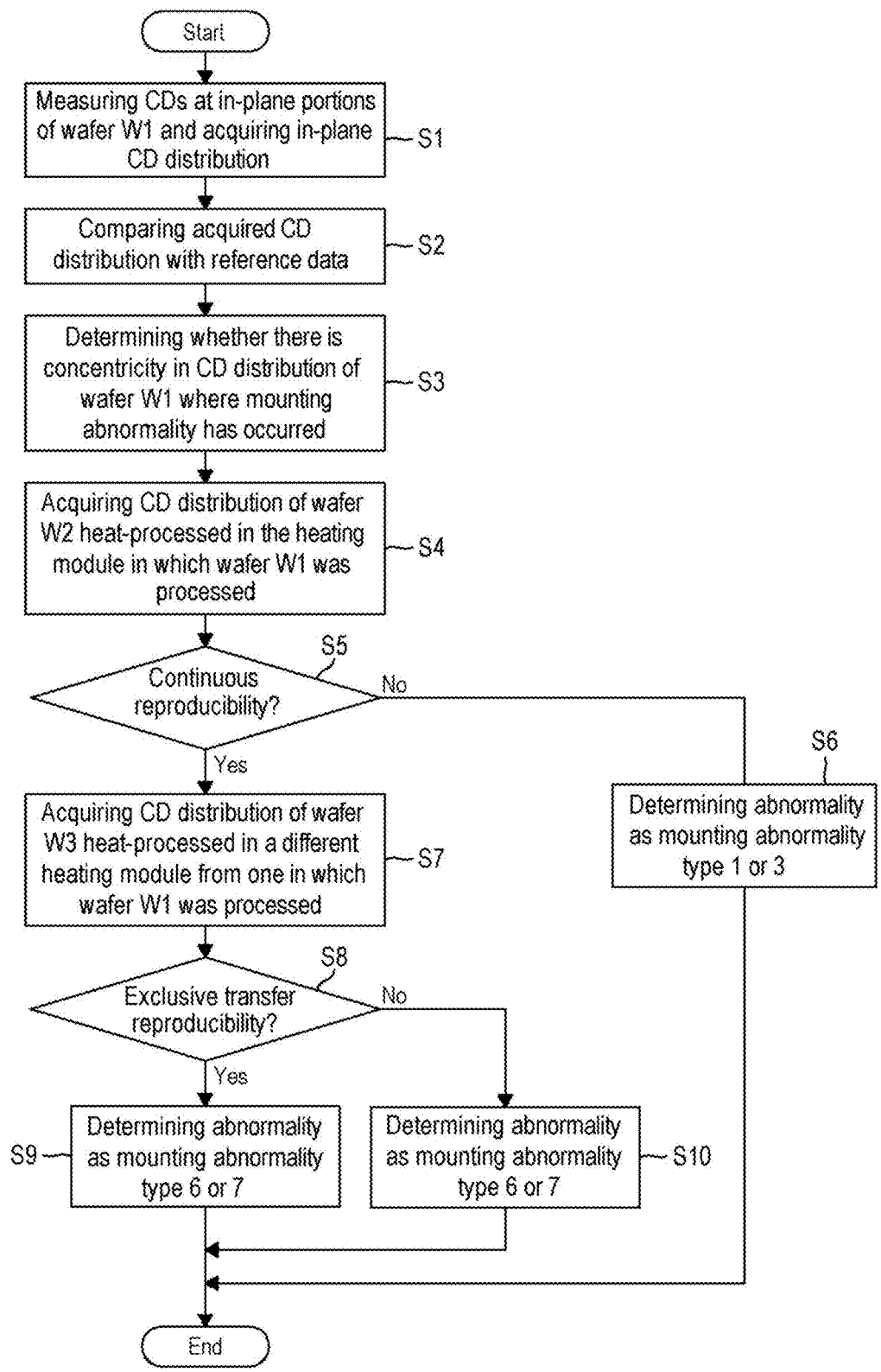
FIG. 20 is a flowchart for determining mounting abnormality and a mounting abnormality type.

Subsequently, a flow for determining whether abnormality has occurred in the mounting of the wafer W and which mounting abnormality type causes the abnormality will be described with reference to a flowchart of FIG. 20. In description of the flow, it is assumed that a resist pattern is formed and wafers W from which CD distributions are acquired belong to the same lot.

First, a wafer W (hereinafter, for convenience, referred to as a wafer W1), which is processed by various modules as described in FIG. 1 to have a resist pattern formed thereon, is transferred to the line width measurement module 14. Then, as described in FIG. 4, CDs at a plurality of in-plane places of the wafer W1 are measured, and an in-plane CD distribution of the wafer W1 is acquired (Step S1).

The acquired entire in-plane CD distribution is compared with previously prepared reference data. The reference data is data in which sizes of CDs at in-plane portions of the wafer W1 are set. The reference data is previously stored in, for example, a memory constituting the control part 5. Specifically, the comparison is, for example, to determine whether sizes of CDs acquired from in-plane measurement places 44 of the wafer W1 and CDs of places except the measurement places 44, which are estimated from the CDs at the measurement places 44, correspond to sizes of CDs of the reference data (Step S2). In Step S2, when it is determined that the sizes of the CDs correspond to sizes of the CDs of the reference data, the wafer W1 is recognized as a wafer W in which the distribution of CDs is normal, to be returned to the carrier C.

In Step S2, when it is determined that the sizes of the CDs do not correspond to sizes of the CDs of the reference data, it is determined that an abnormality has occurred in the mounting state of the wafer W1 on the heat plate 21, and an alarm representing the determination is output. When the wafer W1 is returned to the carrier C, it is determined whether there is the concentricity in the CD distribution of the wafer W1 (Step S3).

Subsequently, a wafer W2 is transferred to the line width measurement module 14. The wafer W2 is a wafer W heat-processed in one of the heating modules 2A and 2B, which has heat-processed the wafer W1. Like the wafer W1, CDs are measured with respect to the wafer W2, to acquire an in-plane CD distribution of the wafer W2 (Step S4), and it is determined whether the in-plane CD distribution of the wafer W2 is a distribution identical to the in-plane CD distribution of the wafer W1. In other words, it is determined whether there is the continuous reproducibility in the CD distribution of the wafer W2 (Step S5). After the CD distribution is acquired, the wafer W2 is returned to the carrier C.

If it is determined in Step S3 that the concentricity exists in the wafer W1 when it is determined in Step S5 that the continuous reproducibility does not exist, it is determined that the abnormality of the mounting abnormality type 1 has occurred, because a mounting abnormality type in which the concentricity exists and the continuous reproducibility does not exist corresponds to only the mounting abnormality type 1 described in FIGS. 6 and 7 among the mounting abnormality types 1 to 7 described in FIGS. 6 to 19. Further, if it is determined in Step S3 that the concentricity does not exist in the wafer W1 when it is determined in Step S5 that the continuous reproducibility does not exist, it is determined that the abnormality of the mounting abnormality type 3 has occurred, because a mounting abnormality type in which the concentricity does not exist and the continuous reproducibility does not exist corresponds to only the mounting abnormality type 3 described in FIGS. 10 and 11 among the mounting abnormality types 1 to 7. If a mounting abnormality type is determined as described above, an alarm corresponding to the determined mounting abnormality type is output (Step S6).

When it is determined in Step S5 that the continuous reproducibility exists, a wafer W3 is transferred to the line width measurement module 14. The wafer W3 is a wafer heat-processed by one of the heating modules 2A and 2B, to which the wafers W1 and W2 are not transferred. Then, like the wafers W1 and W2, line width measurement is performed on the wafer W3, thereby acquiring an in-plane CD distribution of the wafer W3 (Step S7). It is determined whether the in-plane CD distribution of the wafer W3 is a distribution identical to the in-plane CD distribution of the wafer W1 (Step S8). After the CD distribution is acquired, the wafer W3 is returned to the carrier C.

Meanwhile, it has been described that the exclusive transfer reproducibility means whether a CD distribution acquired from a wafer W heat-processed by one heating module is identical to the CD distribution acquired when the wafer W is heat-processed in the other heating module. In other words, it has been described that the same wafer W1 is transferred to the one heating module and the other heating module. However, in such a case, since the wafers W1 and W3 are included in the same lot, the wafers W1 and W3 are formed in the same shape because when one wafer warps the other wafer also warps. Therefore, in Step S8, it is assumed that W1=W3, and it is determined, from CD distributions acquired from the wafers W1 and W3, whether there is the exclusive transfer reproducibility.

In Step S8, when the CD distributions acquired from the wafers W1 and W3 are identical to each other, i.e., when it is determined that the exclusive transfer reproducibility exists, the mounting abnormality type 6 or 7 occurs in which both the continuous reproducibility and the exclusive transfer reproducibility exist, among the mounting abnormality types 1 to 7 described in FIGS. 6 to 19 (see FIGS. 16 to 19). Subsequently, in the CD distribution acquired from any one of the wafers W1, W2, and W3, it is determined whether a CD at the peripheral portion of the wafer W is larger or smaller than a CD at the central portion of the wafer W. When it is determined that the CD at the peripheral portion of the wafer W is larger than the CD at the central portion of the wafer W, the occurring abnormality is determined to be the mounting abnormality type 6. When it is determined that the CD at the peripheral portion of the wafer W is smaller than the CD at the central portion of the wafer W, the occurring abnormality is determined as the mounting abnormality type 7. If the mounting abnormality type is determined as described above, an alarm corresponding to the determined mounting abnormality type is output (Step S9).

When it is determined in Step S8 that the exclusive transfer reproducibility does not exist, a mounting abnormality type in which the continuous reproducibility exists and the exclusive transfer reproducibility does not exist is the mounting abnormality type 2, 4, or 5, and hence any one of the mounting abnormality types 2, 4, and 5 occurs. Among the mounting abnormality types 2, 4, and 5, a mounting abnormality type in which the concentricity exists is only the mounting abnormality type 2 shown in FIGS. 8 and 9. Hence, when it is determined in Step S3 that the concentricity exists in the wafer W1, the occurring abnormality is determined to be the mounting abnormality type 2. When it is determined in Step S3 that the concentricity does not exist in the wafer W1, the occurring abnormality is determined to be any one of the mounting abnormality types 4 and 5 (see FIGS. 12 to 15). In addition, an alarm representing that the occurring abnormality has been determined to be the mounting abnormality type 2 or any one of the mounting abnormality types 4 and 5 is output (Step S10).

When the alarm representing that the mounting abnormality type 4 or 5 has occurred is output, for example, the transfer of the wafer W in the coating and developing apparatus 1 is stopped for the moment, and cleaning of the heat plate 21 of the heating module in which the mounting abnormality of the wafers W1 and W2 has occurred is performed by the user recognizing that the abnormality has occurred through the alarm. When the foreign substance H is attached to the heat plate 21, the foreign substance H is removed by the cleaning. Thereafter, as the transfer of the wafer W is resumed, a wafer W4 developed after being heated on the heat plate 21 that has been cleaned is transferred to the line width measurement module 14, and a CD distribution of the wafer W4 is acquired. The wafer W4 from which the CD distribution is acquired is returned to the carrier C. Like Step S2, it is determined whether there is the mounting abnormality of the wafer W4, based on the CD distribution acquired from the wafer W4.

Then, when it is determined that the mounting abnormality exists, the mounting abnormality occurs due to a cause except the foreign substance H on the heat plate 21. Hence, the occurring abnormality is determined to be the mounting abnormality type 5, and an alarm representing the determination is output. When it is determined that the mounting abnormality does not exist, the mounting abnormality of the wafer W1 occurs due to the foreign substance H. Hence, the abnormalities of the wafers W1 and W2 are determined to occur due to the mounting abnormality type 4.

Handling After Determination of Mounting Abnormality Type 2

Like when the alarm representing that the mounting abnormality type 4 or 5 has occurred is output, when the alarm representing that the mounting abnormality type 2 has occurred is output, for example, the transfer of the wafer W in the coating and developing apparatus 1 is stopped, and cleaning of the heat plate 21 of the heating module in which the mounting abnormalities of the wafers W1 and W2 have occurred is performed by the user recognizing that the abnormality has occurred through the alarm. Accordingly, the foreign substance H on the heat plate 21 is removed. After the cleaning is performed, the transfer of the wafer W is resumed. At this time, the foreign substance H has been removed, and hence it is possible to prevent mounting abnormality from occurring in a subsequent wafer W.

Handling After Determination of Mounting Abnormality Type 5

When the alarm representing that the mounting abnormality type 5 has occurred is output, the transfer of the wafer W in the coating and developing apparatus 1 is stopped, and adjustment of a position at which the transfer mechanism 16 moves up and down with respect to the cooling plate 36 of the heating module that has heat-processed the wafers W1, W2, and W4 is performed by the user recognizing that the abnormality has occurred through the alarm. Accordingly, a subsequent wafer W is mounted at a normal position of the cooling plate 36, and thus any mounting abnormality of the heat plate 21 does not occur. After the adjustment of a position at which the transfer mechanism 16 moves up and down is performed, the transfer of the wafer W is resumed.

Handling After Determination of Mounting Abnormality Type 6

Figure 21:
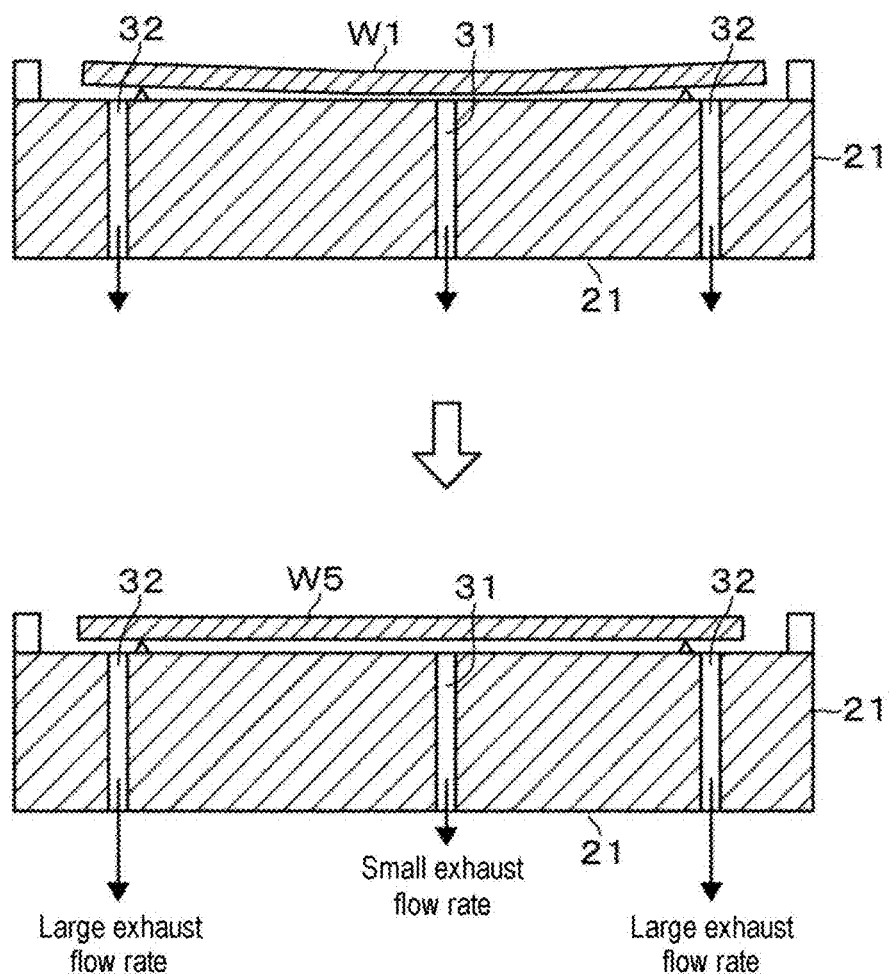
FIG. 21 is a longitudinal cross sectional side view of the heat plate.

When it is determined that the mounting abnormality type 6 has occurred, data stored in the memory of the control part 5 and defining opening degrees of the valves V1 and V2 when the wafer W is mounted on the heat plate 21 of each of the heating modules 2A and 2B is updated. More specifically, the data is changed such that the opening degree of the valve V1 decreases by a predetermined amount and the opening degree of the valve V2 increases by a predetermined amount. Accordingly, the exhaust flow rate from the exhaust port 31 decreases by a predetermined amount, and the suction force toward the heat plate 21 at the central portion of the wafer W decreases. In addition, the exhaust flow rate from the exhaust port 32 increases by a predetermined amount, and the suction force toward the heat plate 21 at the peripheral portion of the wafer W increases. That is, the ratio of the exhaust flow rate from the exhaust port 32 to the exhaust flow rate from the exhaust port 31 is changed. Accordingly, the warpage of a subsequent wafer W (referred to as W5) transferred to the heating module 2A or 2B after Step S9 of the flow is performed, is resolved, and the wafer W5 is heated in a horizontal state, as shown in FIG. 21, so that it is possible to prevent mounting abnormality from occurring. In addition, exhaust from the exhaust port 31 may be stopped.

Handling After Determination of Mounting Abnormality Type 7

Figure 22:
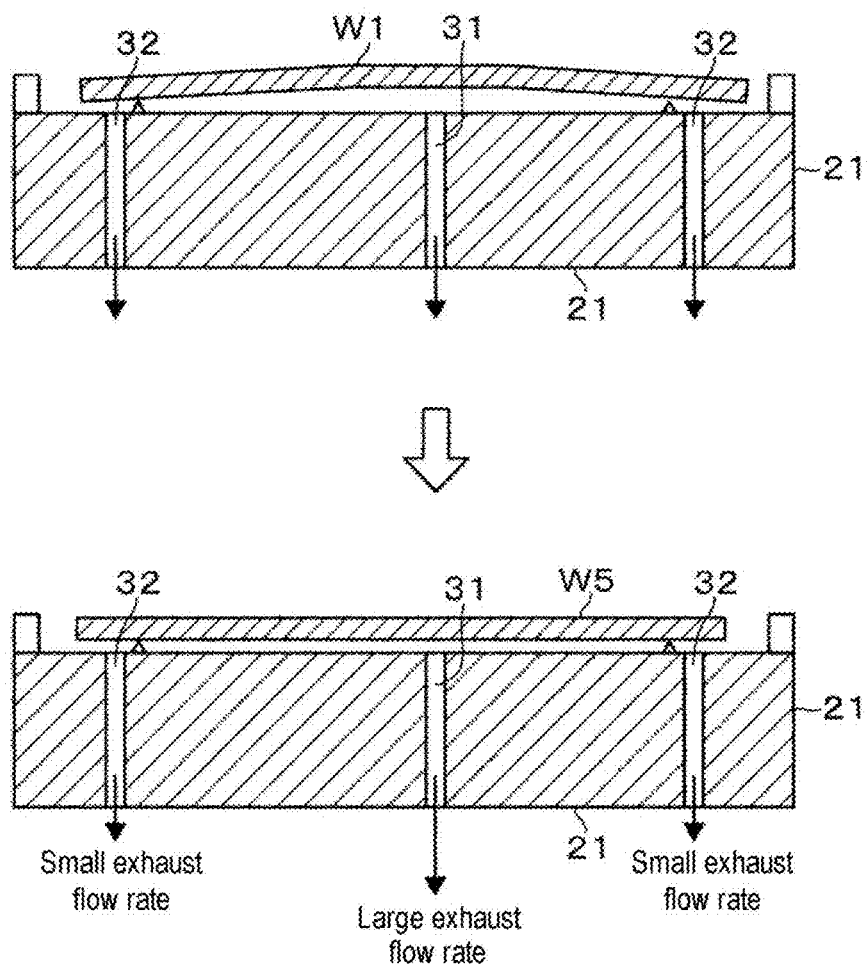
FIG. 22 is a longitudinal cross sectional side view of the heat plate.

When it is determined that the mounting abnormality type 7 has occurred, the data defining opening degrees of the valves V1 and V2 is updated. More specifically, the data is changed such that the opening degree of the valve V2 decreases by a predetermined amount and the opening degree of the valve V1 increases by a predetermined amount. Accordingly, the exhaust flow rate from the exhaust port 31 increases by a predetermined amount, and the suction force toward the heat plate 21 at the central portion of the wafer W decreases. In addition, the exhaust flow rate from the exhaust port 32 decreases by a predetermined amount, and the suction force toward the heat plate 21 at the peripheral portion of the wafer W decreases. Accordingly, the warpage of the subsequent wafer W5 transferred to the heating module 2A or 2B after Step S9 of the flow is performed, is resolved, and the wafer W5 is heated in the horizontal state, as shown in FIG. 22, so that it is possible to prevent a mounting abnormality from occurring. In addition, exhaust from the exhaust port 32 may be stopped.

Meanwhile, for wafers W1 to W4 in which CD distributions are measured to determine the above-described mounting abnormality types, there is a wafer stored in the carrier C in a state in which a defect has occurred in the CD of a resist pattern. The coating and developing apparatus 1 removes a resist film from a wafer W on which the resist pattern having such a defect is formed, and reforms a resist pattern. Hereinafter, a sequence of reforming the resist pattern for each determined mounting abnormality type will be described.

Reforming of Resist Pattern when Determined to be Mounting Abnormality Type 1 or 3

As described in the flow, when the occurring abnormality is determined to be the mounting abnormality type 1 or 3, the wafer W1 is returned to the carrier C in a state in which a defect exists in the CD of the resist pattern. Then, since the foreign substance H is attached to the back side of the wafer W1, the wafer W1 is transferred from the carrier C to the back side cleaning module 15, so that the foreign substance H is removed. Subsequently, the wafer W1 is transferred to the resist coating module 12, and the resist film is removed by supplying a thinner to the surface of the wafer W1. Then, a resist is coated, so that the resist film is reformed on the wafer W1.

Thereafter, the wafer W1 is transferred between the modules as indicated by the solid-line arrow in FIG. 1, so that the reformation of the resist pattern and the acquisition of a CD distribution are performed. Then, the wafer W1 is returned to the carrier C. When a wafer W is transferred to the heating module 2A or 2B during the transfer between the modules as described above, the foreign substance H is removed from the back side of the wafer W, so that the wafer W is normally mounted on the heat plate 21.

Reforming of Resist Pattern when Determined to be Mounting Abnormality Type 2 or 4

When the occurring abnormality is determined as the mounting abnormality type 2 or 4, the wafers W1 and W2 are returned to the carrier C in a state in which a defect exists in the CD of the resist pattern. Cleaning of the heat plate 21 of the heating module in which the wafers W1 and W2 are heat-processed as described above is performed, and the transfer of the wafer W in the coating and developing apparatus 1 is resumed. Then, the wafers W1 and W2 are transferred to the resist coating module 12, and the removal of the resist film by a thinner and reformation of a resist film are performed sequentially. Thereafter, the wafers W1 and W2 are transferred to the various modules as described in FIG. 1, and the reformation of the resist pattern and the acquisition of a CD distribution are performed. Then, the wafers W1 and W2 are returned to the carrier C.

Reforming of Resist Pattern when Determined to be Mounting Abnormality Type 5

When the occurring abnormality is determined to be the mounting abnormality type 5, the wafers W1, W2, and W4 are returned to the carrier C in a state in which a defect exists in the CD of the resist pattern. The position at which the transfer mechanism 16 moves up and down is adjusted as described above, and the transfer of a wafer W in the coating and developing apparatus 1 is resumed. Then, like the wafers W1 and W2 when their abnormalities are determined to be the mounting abnormality type 2 or 4, the wafers W1, W2, and W4 are transferred to each module, and the reformation of the resist pattern and the acquisition of a CD distribution are performed.

Reforming of Resist Pattern when Determined to be Mounting Abnormality Type 6 or 7

When the occurring abnormality is determined to be the mounting abnormality type 6 or 7, the wafers W1, W2, and W3 are returned to the carrier C in a state in which a defect exists in the CD of the resist pattern. Like the wafers W1 and W2 when their abnormalities are determined to be the mounting abnormality type 2 or 4, the wafers W1, W2, and W3 are transferred to each module, and the reformation of the resist pattern and the acquisition of a CD distribution are performed. When the wafers W1 to W3 are transferred to the heating module 2A or 2B in the reformation of the resist pattern, the exhaust flow rates of the exhaust ports 31 and 32 of the heat plate 21 are adjusted as described in FIGS. 21 and 22. Hence, the wafers W1 to W3 are heat-processed such that any mounting abnormality with respect to the heat plate 21 does not occur.

According to the coating and developing apparatus 1, for a wafer W having a resist pattern formed thereon, the line width measurement module 14 obtains an in-plane CD distribution of the wafer W by optically measuring the size of a CD of the pattern, and it is determined whether an abnormality has occurred in the mounting state of the wafer W on the heat plate 21 of the heating module 2A or 2B that performs the heat processing after exposure, based on the CD distribution. The determination is performed based on the CD distribution of the pattern as described above, so that it is possible to highly accurately detect whether an abnormality has occurred in the mounting state of the wafer W, which has influence on a change in the size of the CD of the pattern.

Further, according to the coating and developing apparatus 1, it is determined whether a mounting abnormality is caused by the foreign substance H on a back side of a wafer W, based on a CD distribution of a pattern acquired from the wafer W1 heat-processed by one of the heating modules 2A and 2B and a CD distribution of a pattern acquired from the wafer W2 heat-processed after the wafer W1 is heat-processed by the one heating module. In addition, the mounting abnormality type is more specifically determined using also a CD distribution of a pattern acquired from the wafer W3 heat-processed by the other heating module. Thus, the user of the coating and developing apparatus 1 may easily detect a cause of the mounting abnormality, to perform handling such as the cleaning of the heat plate 21 or the adjustment of the delivery positions of the wafer W by the transfer mechanism 16, depending on a specific cause. Accordingly, the time during which an operation of the coating and developing apparatus 1 stops so as to detect the cause of the mounting abnormality can be omitted or reduced, and hence it is possible to suppress deterioration of the operating efficiency of the coating and developing apparatus 1.

When a cause of the occurrence of the abnormality is determined, and the determined cause is warpage of a wafer W, the exhaust flow rate of each of the exhaust ports 31 and 32 from the heat plate 21 is automatically adjusted, so that it is possible to suppress mounting abnormality from occurring in a subsequent wafer W. Thus, it is possible to reduce a user's effort required to adjust the heating modules 2A and 2B so as to suppress the occurrence of mounting abnormality.

Further, the removal and reformation of a resist film is performed on a wafer W of which the mounting state on the heat plate 21 is abnormal. In addition, when it is determined that the mounting abnormality is caused by the foreign substance H on a back side of the wafer W, cleaning of the back side of the wafer W is performed, so that the mounting abnormality does not occur any more. Then, the wafer W is transferred to the heating module 2A or 2B. Thus, it is possible to improve the yield of semiconductor products manufactured from the wafer W. The cleaning of the back side of the wafer W has only to be performed until the wafer W is transferred to the heating module 2A or 2B, and thus is not limited to be performed at the above-described timing. Therefore, for example, the wafer W exposed in the exposure device 11 may be transferred to the back side cleaning module 15. However, the cleaning of the back side of the wafer W is preferably performed quickly such that the foreign substance H carried into another module other than the back side cleaning module does not pollute the other module and such that processing abnormality does not occurs in the other module. In other words, the wafer W is preferably transferred such that the number of modules through which the wafer W goes until it is transferred to the back side cleaning module is small. The exposure device 11 is also included in the modules mentioned herein. For example, if the wafer W is transferred to the exposure device 11 with the foreign substance H attached to the back side of the wafer W, defocusing may occur as processing abnormality. For this reason, the cleaning of the back side of the wafer W is preferably performed before the wafer W is carried into the exposure device 11.

However, preparation of the determination as to the abnormality of CDs of the wafer W is not limited to preparation of reference data defining CDs at in-plane portions of the wafer W as described above. For example, a variance is calculated with respect to CDs acquired at a plurality of in-plane places of the wafer W. If the calculated value is equal to or greater than a threshold, the CD distribution may be abnormal. If the calculated value is smaller than the threshold, the CD distribution may be normal. Alternatively, if the differential values of CDs at a plurality of places along the diameter direction of the wafer W are equal to or smaller than a threshold, the CD distribution may be normal. If any of the differential values exceeds the threshold, the CD distribution may be abnormal.

Figure 23:
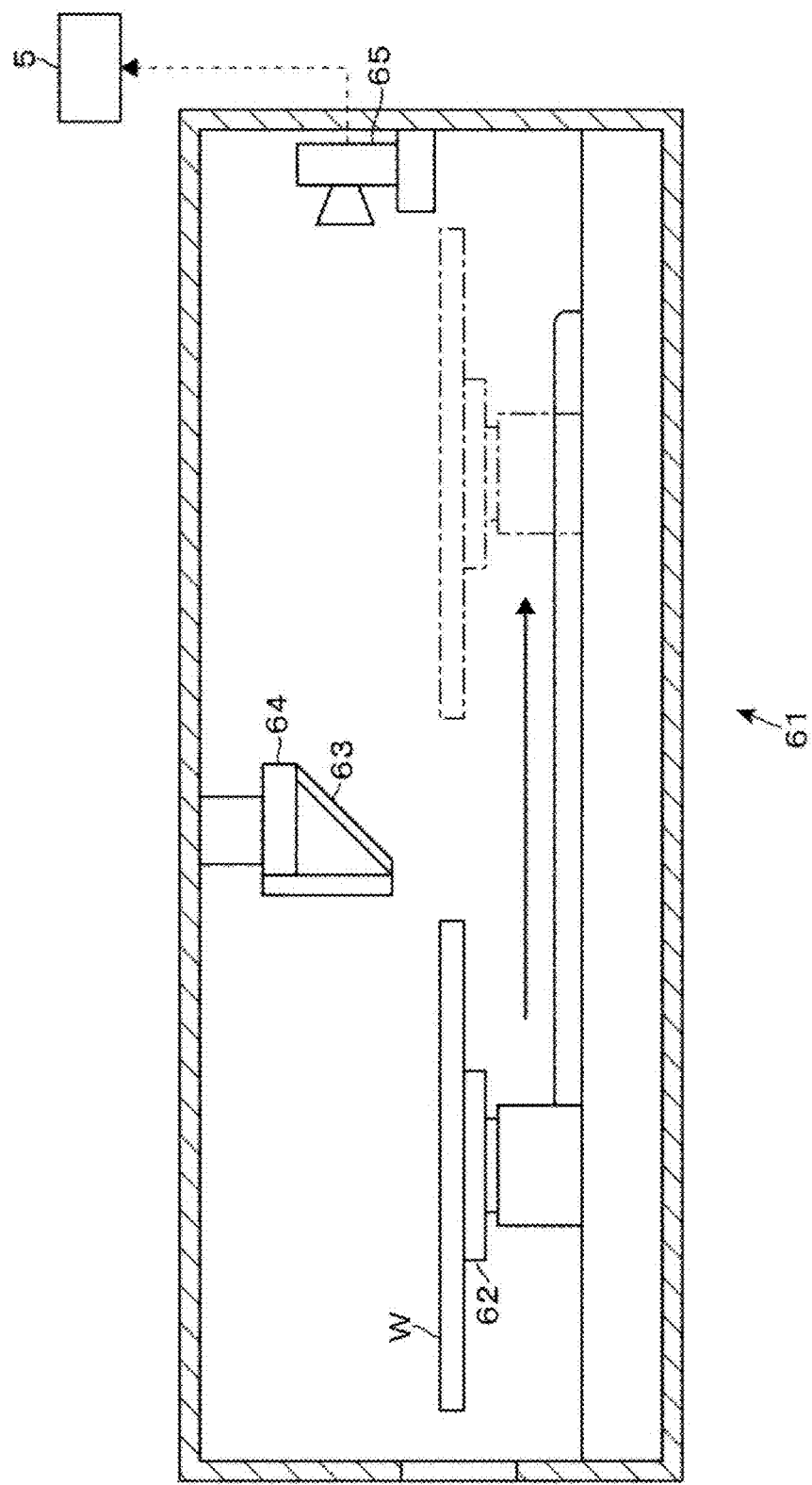
FIG. 23 is a schematic longitudinal cross sectional side view of a wafer imaging module included in the coating and developing apparatus.

Meanwhile, instead of the line width measurement module 14, a wafer imaging module 61 shown in FIG. 23 may be installed as a module for optically acquiring a CD distribution of a wafer W. In FIG. 23, reference numeral 62 designates a mounting table, and the mounting table 62 is configured to horizontally mount the wafer W thereon and to be horizontally movable forward and backward. In FIG. 23, reference numeral 63 designates a half mirror, and the half mirror 63 is provided above forward and backward paths of the wafer W mounted on the mounting table 62. In FIG. 23, reference numeral 64 designates a lighting part configured with, for example, a light emitting diode (LED). The lighting part 64 is provided above the half mirror 63, and irradiates a movement path of the wafer W provided under the lighting part 64 with light through the half mirror 63. In FIG. 23, reference numeral 65 designates a camera, and the camera 65 is provided with an imaging device including a charge coupled device (CCD). An output signal of the imaging device is transmitted to the control part 5, and the control part 5 can acquire image data from the output signal.

Light from the lighting part 64 passes through the half mirror 63, and reaches an irradiation region below the half mirror 63. Then, light reflected from an object on the irradiation region is reflected from the half mirror 63, to be introduced to the camera 65. That is, the camera 65 may image an object located below the half mirror 63. In addition, the camera 65 intermittently performs the imaging under the half mirror 63 while the wafer W is moving forward, so that different regions of the wafer W are imaged with a time lag. Accordingly, the entire surface of the wafer W is imaged to acquire image data of the entire surface of the wafer W.

The acquired image data represents in-plane portions of the wafer W by different gray values. That is, the control part 5 acquires an in-plane luminance distribution of the wafer W through the imaging performed by the camera 65. As shown in the following Evaluation Test, there is a correlation between a size of a CD and a luminance Therefore, the various determinations that have already been described may be performed by considering the luminance distribution as a CD distribution. For example, when it is determined in Step S2 of the flow chart whether an abnormality has occurred in the mounting state of the wafer W, data defining luminances at in-plane portions of the wafer W as reference data is compared with acquired luminances at the in-plane portions of the wafer W.

That a CD distribution of the wafer W is acquired by performing the imaging using the camera 65 is also included in that a CD distribution is optically acquired. The wafer imaging module 61 can be used as described above.

Figure 24:
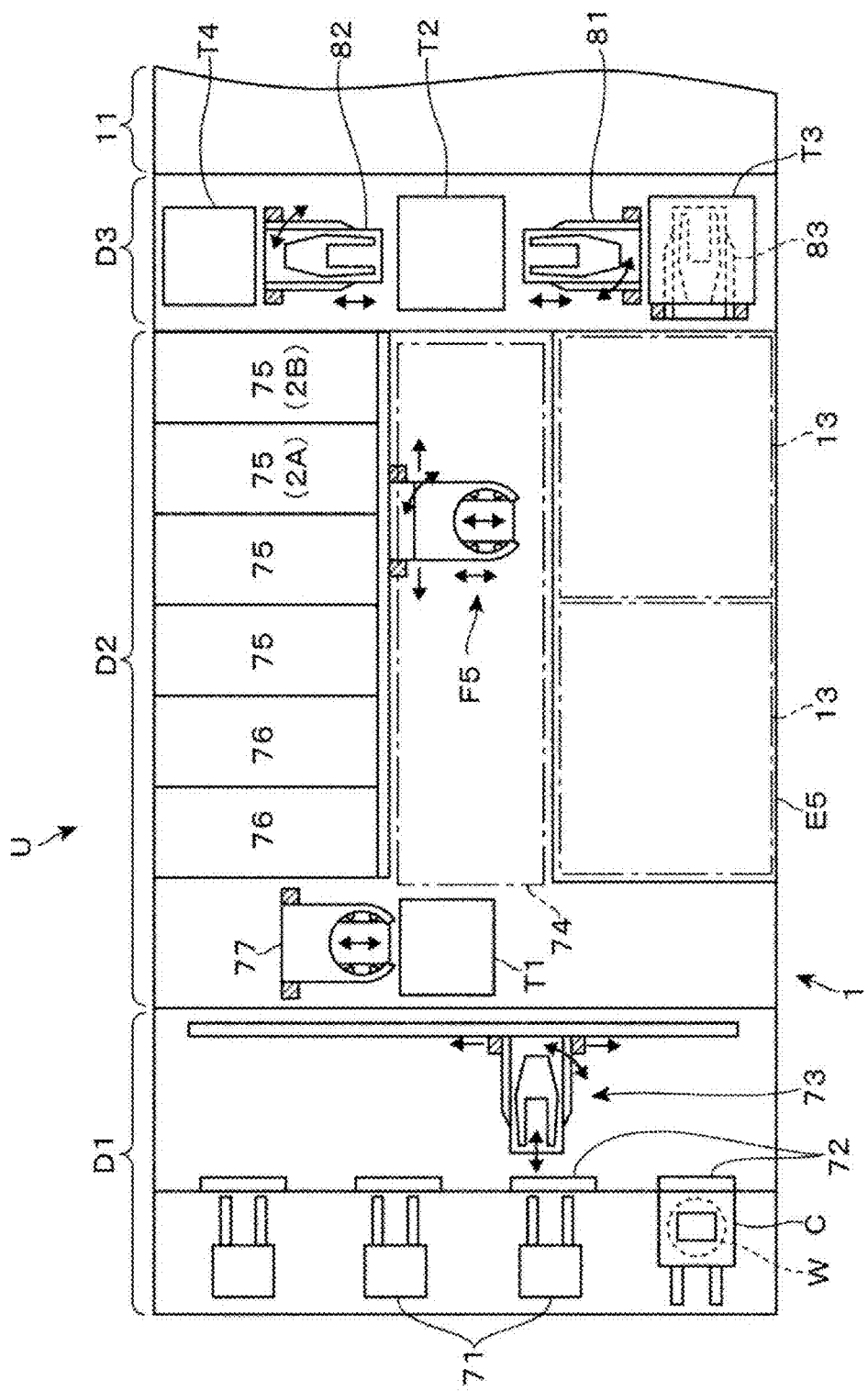
FIG. 24 is a detailed plan view of the coating and developing apparatus.
Figure 25:
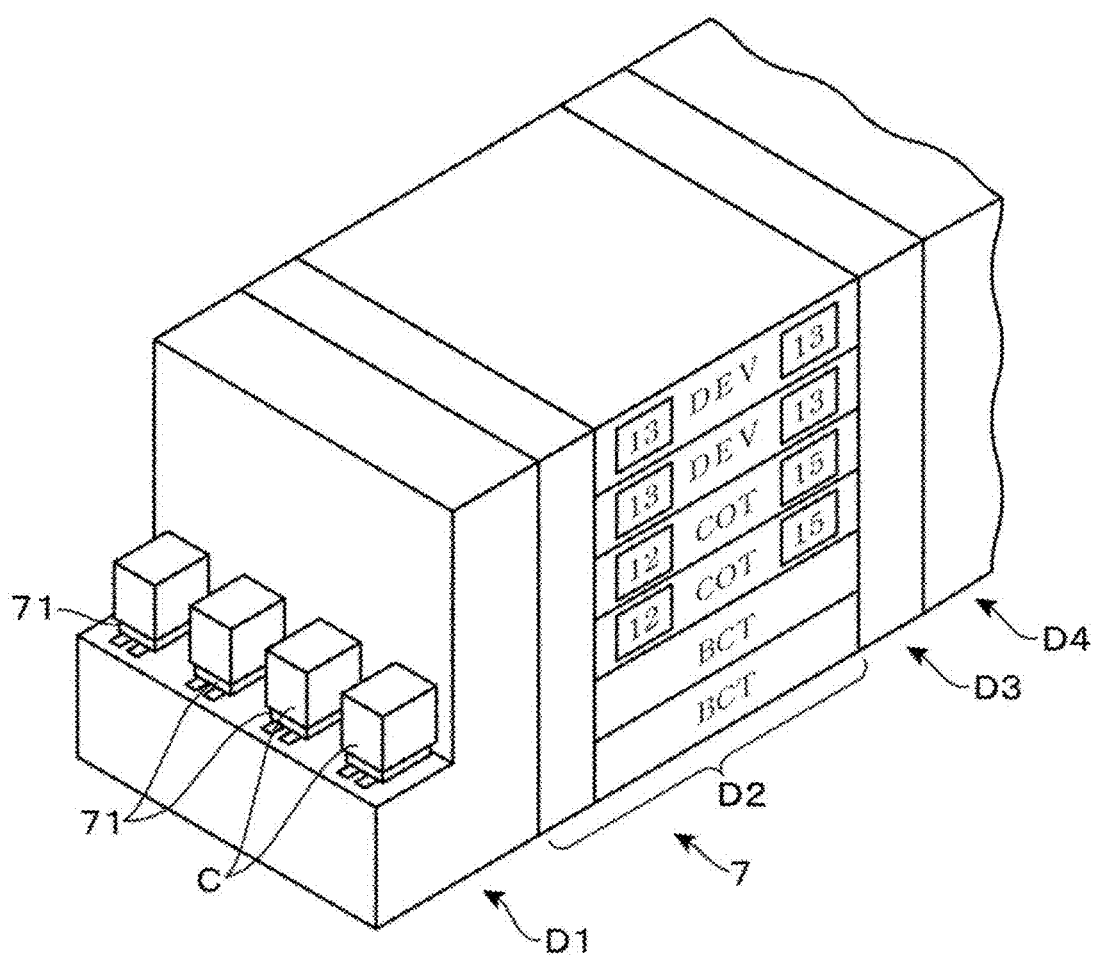
FIG. 25 is a perspective view of the coating and developing apparatus.
Figure 26:
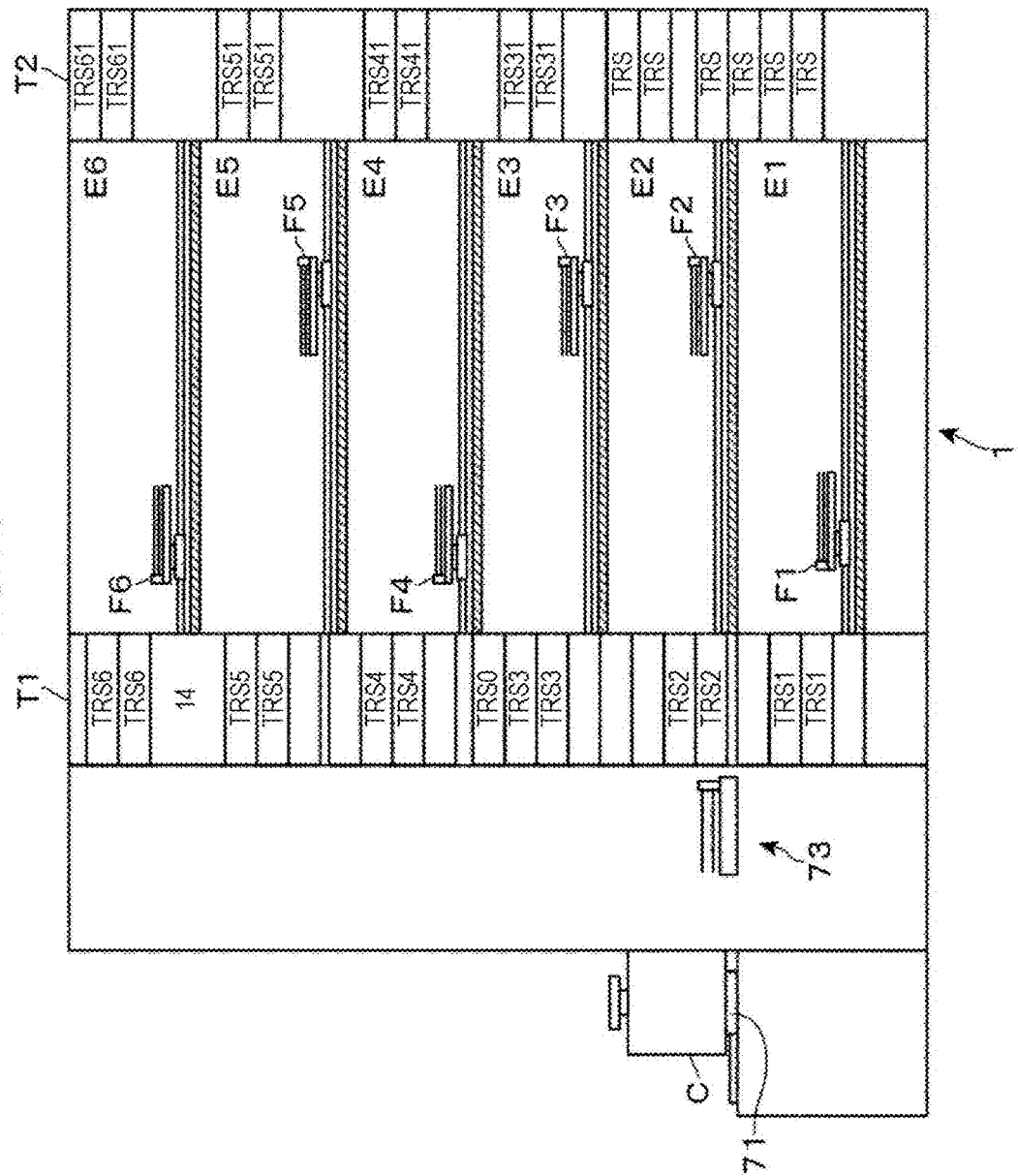
FIG. 26 is a schematic longitudinal cross sectional side view of the coating and developing apparatus.

An example of a detailed configuration of the coating and developing apparatus 1 is shown in FIGS. 24 to 26. FIGS. 24, 25, and 26 are respectively a plan view, a perspective view, and a schematic longitudinal cross sectional side view of the coating and developing apparatus 1. The coating and developing apparatus 1 is configured such that a carrier block D1, a processing block D2, and an interface block D3 are connected in a straight line shape. The exposure device 11 is connected to the interface block D3. In the following description, the arrangement direction of the blocks D1 to D3 is referred to as the front-back direction. The carrier block D1 loads/unloads the carrier C into/from the inside of the coating and developing apparatus 1. The carrier block D1 includes mounting tables 71 of the carrier C, opening/closing parts 72, and a movable mounting mechanism 73 for transferring wafers W from the carrier C through the opening/closing parts 72.

The processing block D2 is configured by stacking first to sixth unit blocks E1 to E6 for performing liquid processing on the wafers W in turns from below. For convenience of illustration, a process of forming a lower-layer-side antireflection film on the wafer W may be referred to as "BCT," a process of forming a resist film on the wafer W may be referred to as "COT," and a process of forming a resist pattern on the wafer W after exposure may be referred to as "DEV." In this example, as shown in FIG. 25, two BCT layers, two COT layers, and two DEV layers are stacked in turn from below. In the same unit block, the transfer and processing of the wafer W are performed in parallel with each other.

Here, the DEV layer E5 in the unit blocks will be representatively described with reference to FIG. 24. A plurality of rack units U are arranged in the front-back direction at one of left and right sides of a transfer region 74 toward the interface block D3 from the carrier block D1, and two development modules 13 are arranged in the front-back direction at the other of the left and right sides of the transfer region 74 in parallel with the plurality of rack units U. The rack unit U includes a plurality of heating modules 75 for performing PEB, and two of the plurality of heating modules 75 correspond to the heating modules 2A and 2B. Further, the rack unit U includes heating modules 76 for heating the wafer W after development. A transfer arm F5 as a transfer mechanism of the wafer W is installed in the transfer region 74.

Differences of the unit blocks E1 to E4 from the unit blocks E5 and E6 will be described. The unit blocks E1 and E2 include antireflection film forming modules in place of the development module 13. In the antireflection film forming module, a chemical liquid for forming an antireflection film is supplied to the wafer W. Heating modules for heating the wafer W after the formation of the antireflection film are installed in the rack units U of the unit blocks E1 and E2.

The unit blocks E3 and E4 include the resist coating module 12 and the back side cleaning module 15 in place of the development modules 13. Further, the rack units U of the unit blocks E3 and E4 are provided with heating modules for heating the wafer W after the formation of a resist film. Except the above-described differences, the unit blocks E1 to E6 have the same configuration as each other. In FIG. 26, the transfer arms of the unit blocks E1 to E6 are designated by reference symbols F1 to F6, respectively.

A tower T1 extending up and down over the respective unit blocks E1 to E6 and a vertically movable delivery arm 77 for performing delivery of the wafers W with respect to the tower T1 are installed in the processing block D2 near the carrier block D1. The tower T1 is configured with a plurality of modules stacked one above another. The modules installed at the respective heights of the unit blocks E1 to E6 can deliver the wafers W between the modules and the respective transfer arms F1 to F6 of the unit blocks E1 to E6. The modules include delivery modules TRS installed at the respective heights of the unit blocks E1 to E6, temperature adjustment modules CPL for adjusting the temperature of the wafers W, buffer modules for temporarily storing a plurality of wafers W, hydrophobizing modules for hydrophobizing the surfaces of the wafers W, and the like. For simplification of illustration, the hydrophobizing modules, the temperature adjustment modules, and the buffer modules are not shown. In addition, the line width measurement module 14 is installed in, for example, the tower T1.

The interface block D3 includes towers T2, T3 and T4 extending up and down over the unit blocks E1 to E6. In the interface block D3, there are installed an interface arm 81 as a vertically movable delivery mechanism for performing the delivery of the wafers W with respect to the towers T2 and T3, an interface arm 82 as a vertically movable delivery mechanism for performing the delivery of the wafers W with respect to the towers T2 and T4, and an interface arm 83 for performing the delivery of the wafers W between the tower T2 and the exposure device 11.

In the tower T2, delivery modules TRS, a buffer module for storing and accommodating a plurality of wafers W before exposure processing, a buffer module for storing a plurality of wafers W after exposure processing, temperature adjustment modules for adjusting the temperature of the wafer W and the like are stacked one above another. Here, the buffer modules and the temperature adjustment modules are not shown. In addition, modules are also installed in the towers T3 and T4. These modules will not be described here. Meanwhile, the transfer mechanism 16 described in FIG. 1 is configured with the transfer arms F1 to F6, the movable mounting mechanism 73, the delivery arm 77, and the interface arms 81 to 83, and the transfer mechanism shown as the transfer mechanism 16 in FIG. 3 is the transfer arm F5.

A general transfer of wafers W in a system including the coating and developing apparatus 1 and the exposure device 11 will be described. The transfer corresponds to a transfer indicated by the solid-line arrow of FIG. 1. The wafers W are transferred from the carrier C to a delivery module TRS0 of the tower T1 in the processing block D2 by the movable mounting mechanism 73. The wafers W are transferred from the delivery module TRS0 and assigned to the unit blocks E1 and E2. For example, when the wafers W are delivered to the unit block E1, the wafers W are delivered from the delivery module TRS0 to a delivery module TRS1 (a delivery module to which the wafers W can be delivered by the transfer arm F1) corresponding to the unit block E1 among the delivery modules TRS of the tower T1. Further, when the wafers W are delivered to the unit block E2, the wafers W are delivered from the delivery module TRS0 to a delivery module TRS2 corresponding to the unit block E2 among the delivery modules TRS of the tower T1. The delivery of the wafers W is performed by the delivery arm 77.

The wafers W assigned as described above are transferred to the delivery module TRS1 (TRS2), the antireflection film forming module, the heating module, and the delivery module TRS1 (TRS2) in this order. Subsequently, the wafers W are assigned, by the delivery arm 77, to a delivery module TRS3 corresponding to the unit block E3 and a delivery module TRS4 corresponding to the unit block E4.

The wafers W assigned to the delivery modules TRS3 and TRS4 as described above are transferred to the delivery module TRS3 (TRS4), the resist coating module 12, the heating module, and a delivery module TRS31 (TRS41) of the tower T2 in this order. Thereafter, the wafers W are loaded into the exposure device 11 through the tower T3 by the interface arms 81 and 83. The wafers W after exposure are transferred between the towers T2 and T4 by the interface arms 82 and 83, to be respectively transferred to delivery modules TRS51 and TRS61 of the tower T2 corresponding to the unit blocks E5 and E6, respectively. Thereafter, the wafers W are transferred to the heating module 75 (2A or 2B), the development module 13, the heating module 76, and a delivery module TRS5 (TRS6) of the tower T1, and then transferred to the line width measurement module 14 by the delivery arm 77. Thereafter, the wafers W are returned to the carrier C through the movable mounting mechanism 73.

For example, when it is determined that mounting abnormality has occurred due to the mounting abnormality type 1 or 3 and the back side cleaning and the reformation of a resist pattern are performed on the wafer W, the wafer W is transferred, for example, from the carrier C to the delivery module TRS0, like the general transfer as described above. In addition, the wafer W is assigned from the delivery module TRS0 to the delivery modules TRS3 and TRS4 by the delivery arm 77 and carried in the unit blocks E3 and E4, to be back side cleaning module 15 of each of the unit blocks E3 and E4. After the back side cleaning, the wafer W is transferred to the resist coating module 12, and a resist film is removed by supplying a solvent. Further, an antireflection film below the resist film is not dissolved by the solvent. Subsequently, the wafer W is transferred to each module in the same path as that for the general transfer.

When it is determined that mounting abnormality has occurred due to the mounting abnormality other than the abnormality type 1 or 3 and the reformation of the resist pattern is performed on the wafers W, the wafers W are carried from the carrier C into the unit blocks E3 and E4 in the same transfer path as that when the back side cleaning is performed. Then, the wafers W are not transferred to the back side cleaning module 15 but transferred to the resist coating module 12. Subsequently, the wafers W are transferred to each module in the same path as that for the general transfer.

Meanwhile, a plurality of heating modules installed in the rack unit of the unit blocks E3 and E4 have the same configuration as the heating modules 2A and 2B respectively. The heating modules of the unit blocks E3 and E4 perform heating to evaporate the solvent included in the resist film formed on the wafer W. When mounting abnormality has occurred in the heat plate 21 of each of the heating modules, the CD of the pattern is changed from a designed value. That is, the determination as to whether mounting abnormality has occurred in the heat plate 21 of each of the heating modules of the unit blocks E3 and E4 and the determination of a mounting abnormality type may be performed based on the above-described CD distribution, instead of performing the determination as to whether mounting abnormality has occurred in the heat plate 21 of each of the heating modules 2A and 2B and the determination of a mounting abnormality type.

Evaluation Test

Evaluation Test 1

Figure 27:
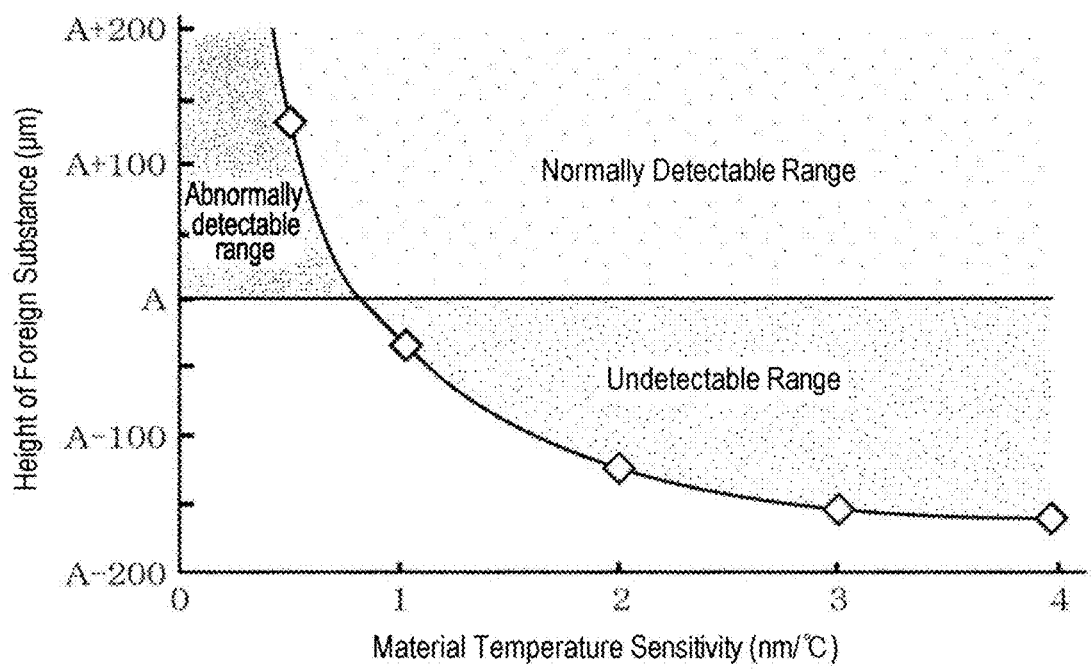
FIG. 27 is a graph showing a result of an evaluation test.

In a case where a wafer W is placed on a foreign substance H on the heat plate 21 when PEB is performed, a threshold of the height of the foreign substance H, at which the CD of a resist pattern after development is not changed from a designed value, was measured by a simulation. That is, if the height of foreign substance H is larger than the threshold, the CD is changed from the designed value. If the height of foreign substance H is equal to or smaller than the threshold, the CD is not changed from the designed value. Thresholds were checked with respect to a plurality of resists having different material temperature sensitivities (unit: nm/° C.), respectively. The material temperature sensitivity is a variance (unit: nm) from a set value of a pattern formed after development with respect to a variance (unit: ° C.) from a set value of a temperature in the PEB. The graph of FIG. 27 shows a correspondence between the threshold of the height of the foreign substance H and the material temperature sensitivity. In the graph, plots are pointed at places corresponding to a measurement result, and an approximate curve obtained from these plots is displayed. The ordinate axis and abscissa axis of the graph represent the threshold and the material temperature sensitivity, respectively, and scales are displayed in a unit of 50 μm on the ordinate axis.

Meanwhile, there is a method for detecting whether a wafer is placed on a foreign substance by monitoring changes in temperature at a plurality of places of the heat plate 21 when the wafer is mounted on the heat plate 21 (hereinafter, referred to as a detection method based on a temperature of the heat plate). In order to perform detection as described above, it is required that the height of the foreign substance H is equal to or larger than a predetermined height. The predetermined height is designated as A μm.

In a range defined by the height of the foreign substance H and the material temperature sensitivity, the CD is changed from the designed value as the wafer W is placed on the foreign substance H, and the range in which it can be detected that the wafer W has been placed on the foreign substance H is referred to as a normally detectable range. Further, the range in which it can be detected that the wafer W has been placed on the foreign substance H and the CD of the pattern is not changed from the designed value although the wafer W is placed on the foreign substance H is referred to as an abnormally detectable range. That is, the abnormally detectable range is a range in which, if it is determined that the CD of the pattern has been changed from the designed value when the wafer W has been placed on the foreign substance H, it is determined that the CD of the pattern has been changed from the designed value even though the CD of the pattern is not changed from the designed value. Further, the range in which it cannot be detected that the wafer W has been placed on the foreign substance H though the CD of the pattern is changed as the wafer W is placed on the foreign substance H is referred to as an undetectable range. The normally detectable range, the undetectable range, and the abnormally detectable range are displayed in the graph. In the detection method based on the temperature of the heat plate, the normally detectable range, the undetectable range, and the abnormally detectable range are partitioned from one another by a straight line representing the height of A μm and the approximate curve in the graph.

Figure 28:
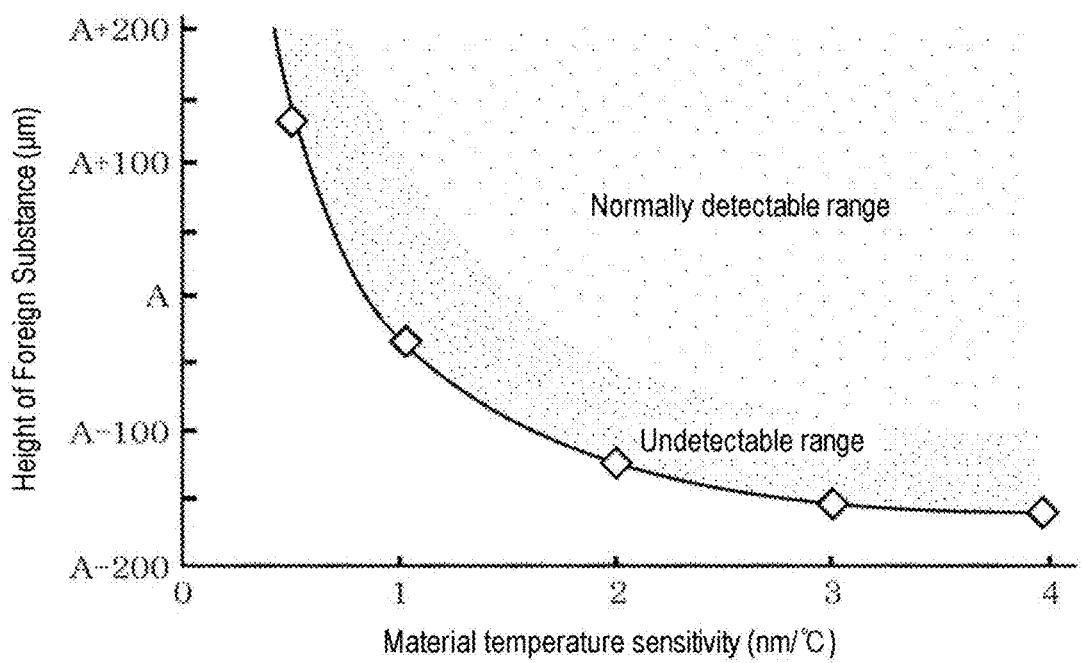
FIG. 28 is a graph showing a result of the evaluation test.

Subsequently, a simulation was performed using the method described in the embodiments of the present disclosure using the wafer imaging module 61, and a normally detectable range, an undetectable range, and an abnormally detectable range were checked. Then, the result was shown in the graph of FIG. 28. The graph of FIG. 28, similar to the graph of FIG. 27, illustrates plots showing a relationship between the threshold of the height of the foreign substance H, at which the CD of the resist pattern is not changed from the designed value, and the material temperature sensitivity, and an approximate curve obtained from such plots. As is clear from the graph, if the height of the foreign substance H is smaller than A μm, the material temperature sensitivity in a range of 1.5 to 4.0 nm/° C. was included in the undetectable range in the detection method based on the temperature of the heat plate 21, but is included in the normally detectable range in the method of the embodiment of the present disclosure. Further, the abnormally detectable range shown in the detection method based on the temperature of the heat plate 21 does not exist in the method of the embodiment. Thus, according to the method of the embodiment of the present disclosure, it is possible to more accurately detect mounting abnormality of a wafer W on the heat plate, in which a CD defect has occurred. Furthermore, it is inferable that the undetectable range may be eliminated using the method described in the embodiment of the present disclosure using the line width measurement module 14.

Evaluation Test 2

PEB was performed in a state a wafer W is placed on a foreign substance H on the heat plate 21, and then the wafer W was developed, thereby performing pattern formation. Thereafter, image data was acquired by imaging the wafer W in the imaging module 61. Further, images (scanning electron microscope (SEM) images) at in-plane portions of the wafer W were acquired by an SEM. Such measurement was performed on a plurality of wafers W, and the height of the foreign substance H on which a wafer W is placed in PEB was changed for every wafer W. Specifically, wafers W were respectively placed on foreign substances H having heights of 30 μm, 56 μm, 93 μm, 189 μm, and 480 μm, and then heated.

Figure 29:
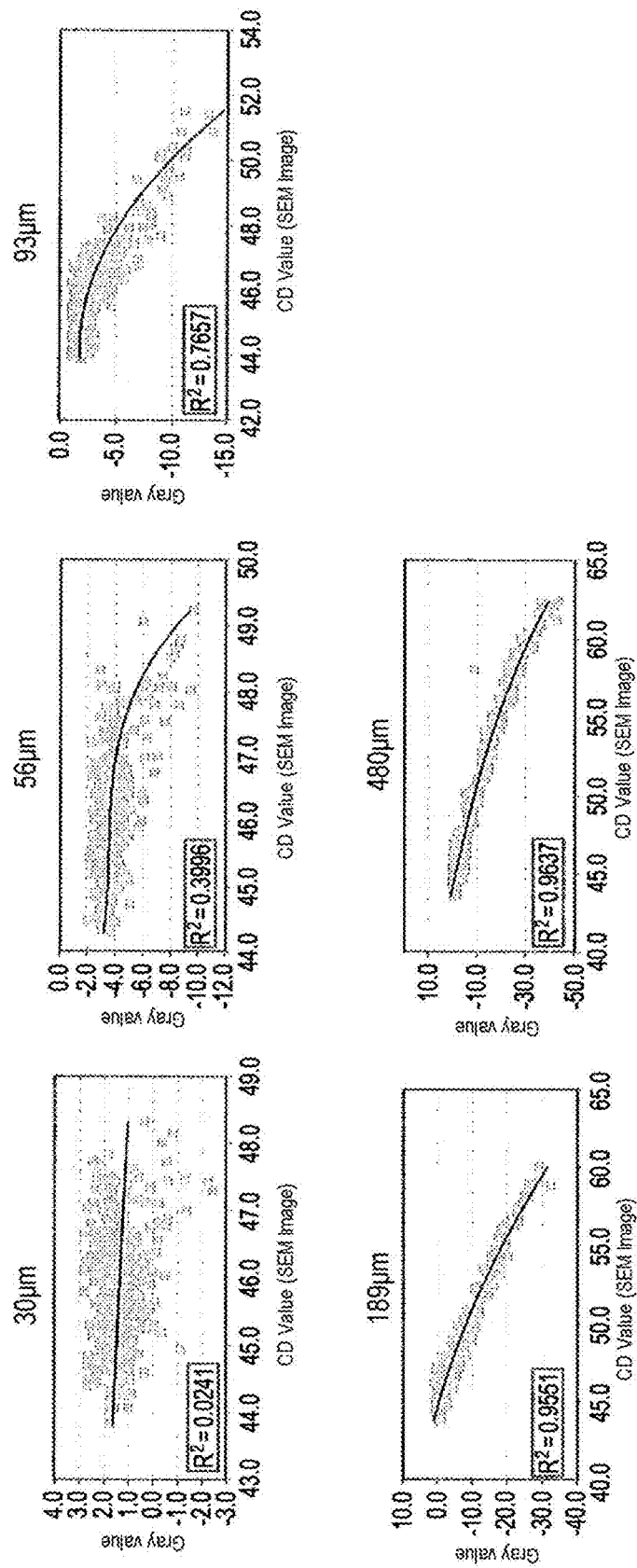
FIG. 29 is a graph showing a result of the evaluation test.

A result of Evaluation Test 2 is shown in each graph of FIG. 29. The ordinate axis of each graph represents gray values, and the abscissa axis of each graph represents values of CDs obtained from SEM images. Further, the dimension at an upper portion of each graph represents a height of the foreign substance H. Plots of a measurement result and an approximate curve obtained from the plots are displayed in the respective graphs. In addition, a determination coefficient $R^2$ of the approximate curve was calculated. When heights of the foreign substance H was 30 μm, 56 μm, 93 μm, 189 μm, and 480 μm, the determination coefficients $R^2$ were 0.0241, 0.3996, 0.7657, 0.9551, and 0.9637, respectively.

Figure 30:
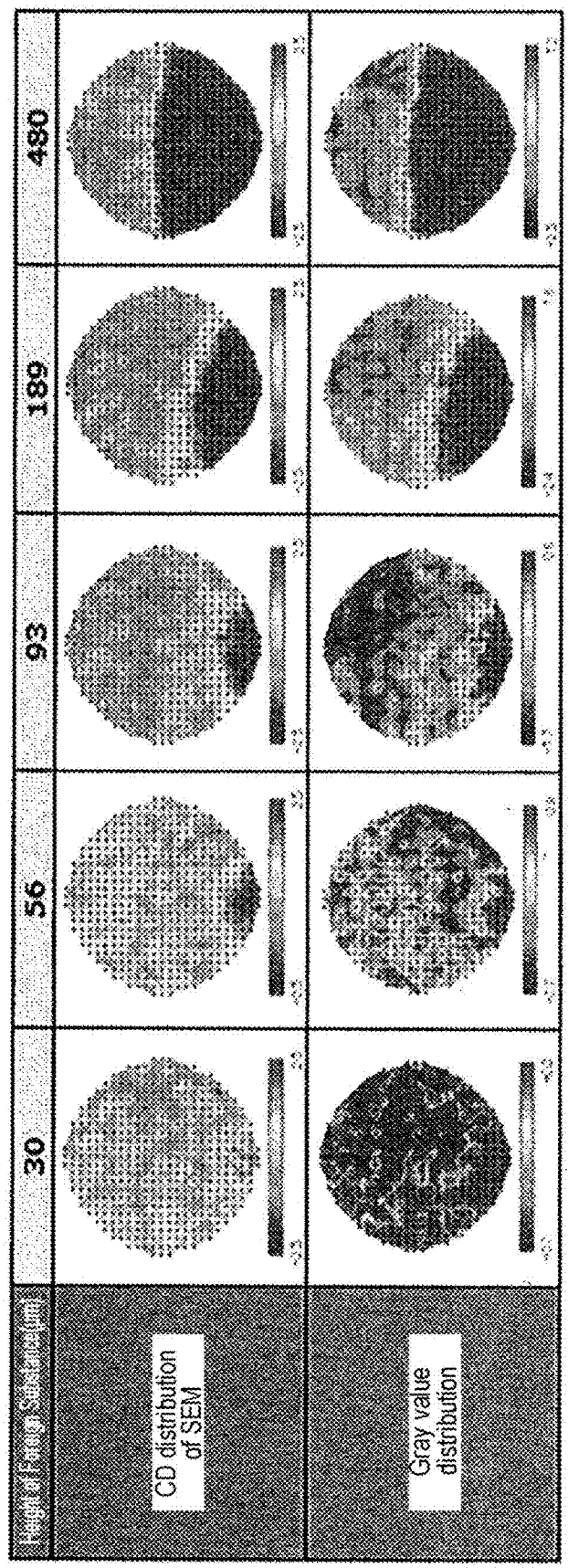
FIG. 30 is a schematic view of a CD distribution of the wafer.

FIG. 30 also shows a result of Evaluation Test 2. An upper end of FIG. 30 represents color images created by a computer, which are shown by adding colors corresponding to CDs acquired from SEM images at in-plane portions of the wafer W, and is hereinafter described as "CD distribution of SEM." A bottom end of FIG. 30 represents color images created by a computer, which are shown by adding colors corresponding to gray values acquired at in-plane portions of the wafer W, and is hereinafter described as "gray value distribution." However, because of space limitations, the CD distribution of SEM and the gray value distribution are shown in monochrome.

It has been confirmed that when the height of the foreign substance H is equal to or larger than 93 µm, the determination coefficient $R^2$ is equal to or larger than 0.7657, which represents a relatively high dimension, and the CD distribution of SEM and the gray value distribution approximately coincide with each other. It has been confirmed that although the height of the foreign substance H is relatively small as described above, the correlation between gray values of image data and CDs measured by SEM, i.e., actual CDs, is relatively high. Thus, a result of Evaluation Test 2 shows that it is possible to determine whether abnormality has occurred in the mounting of a wafer W even although a CD distribution is acquired using the wafer imaging module 61.

According to the present disclosure, a size distribution of a dimension of a pattern is optically acquired with respect to a resist film on which a pattern is formed after development, and after the resist film is formed, it is determined whether abnormality has occurred in a mounting state of a substrate on a heat plate for performing the heat processing before the development. Accordingly, it is possible to highly accurately detect whether abnormality has occurred in the mounting state of the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method, comprising:
    developing, by a development part, a substrate on which an exposed resist film formed to form a pattern on a surface of the substrate;
    mounting and heating the substrate on which the resist film formed on a heat plate before the developing;
    optically acquiring a size distribution of a dimension of the pattern on the surface of the substrate; and
    determining whether an abnormality has occurred in a mounting state of the substrate on the heat plate, based on the acquired size distribution of the dimension of the pattern,
    wherein the determining whether an abnormality has occurred in a mounting state of the substrate mounted on the heat plate includes estimating a cause of the abnormality in the mounting state of a first substrate mounted on the heat plate based on a size distribution of a dimension of a pattern acquired from a second substrate transferred, mounted and heated on the heat plate, when it is determined that an abnormality has occurred in a mounting state of the first substrate mounted on the heat plate.

2. The substrate processing method of claim 1, wherein the resist film of the substrate mounted on the heat plate is a resist film on which the exposure is completed so as to form the pattern.

3. The substrate processing method of claim 1, wherein the heat plate includes a first heat plate and a second heat plate,
    wherein the substrate processing method further comprises:
        mounting and heating the first and second substrates on the first heat plate; and
        mounting and heating a third substrate on the second heat plate,
    wherein the estimating a cause of the abnormality in the mounting state of the first substrate is performed based on a size distribution of a dimension of a pattern acquired from the third substrate.

4. The substrate processing method of claim 1, wherein the estimating a cause of the abnormality in the mounting state of the first substrate includes estimating whether there is warpage of the first substrate as the cause of the abnormality,
    wherein the substrate processing method further comprises changing a ratio of an exhaust flow rate of a first suction port installed in the heat plate to suck a central portion of each of the first substrate and the second substrate to an exhaust flow rate of a second suction port installed in the heat plate to suck a peripheral portion each of the first substrate and the second substrate so as to resolve warpage of the second substrate transferred and mounted on the heat plate when it is estimated that the warpage exists in the first substrate.

5. The substrate processing method of claim 1, wherein the estimating a cause of the abnormality in the mounting state of the first substrate includes estimating whether a foreign substance has been attached to a back side of the first substrate as the cause of the abnormality,
    wherein the substrate processing method further comprises:
        removing a resist film of the first substrate when it is estimated that the foreign substance has been attached;
        reforming a resist film on the first substrate from which the resist film is removed; and
        cleaning the back side of the first substrate before the first substrate is re-mounted on the heat plate.

6. A non-transitory computer-readable storage medium storing a computer program used in a substrate processing apparatus for developing a substrate on which an exposed resist film formed to form a pattern,
    wherein the program includes a group of steps for performing the substrate processing claim 1.

* * * * *

UNITED STATES PATENT AND TRADEMARK OFFICE
CERTIFICATE OF CORRECTION

PATENT NO. : 11,430,704 B2
APPLICATION NO. : 16/502310
DATED : August 30, 2022
INVENTOR(S) : Kanzo Kato It is certified that error appears in the above-identified patent and that said Letters Patent is hereby corrected as shown below:

In the Claims

Claim 6, Column 24, Line 58, please delete the phrase "peforming the substrate processing claim 1" and replace with "performing the substrate processing method of claim 1".

Signed and Sealed this
Eighteenth Day of October, 2022

Katherine Kelly Vidal
*Director of the United States Patent and Trademark Office*